US007906041B2

(12) United States Patent
Li et al.

(10) Patent No.: US 7,906,041 B2
(45) Date of Patent: *Mar. 15, 2011

(54) SILICATE-BASED GREEN PHOSPHORS IN RED-GREEN-BLUE (RGB) BACKLIGHTING AND WHITE ILLUMINATION SYSTEMS

(75) Inventors: Yi-Qun Li, Danville, CA (US); Yi Dong, Tracy, CA (US); Dejie Tao, Fremont, CA (US); Shifan Cheng, Moraga, CA (US); Ning Wang, San Jose, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/542,164

(22) Filed: Aug. 17, 2009

(65) Prior Publication Data

US 2009/0294731 A1 Dec. 3, 2009

Related U.S. Application Data

(63) Continuation of application No. 11/269,953, filed on Nov. 8, 2005, now Pat. No. 7,575,697, which is a continuation-in-part of application No. 11/100,103, filed on Apr. 5, 2005, now abandoned, which is a continuation-in-part of application No. 10/948,764, filed on Sep. 22, 2004, now Pat. No. 7,311,858, and a continuation-in-part of application No. 10/912,741, filed on Aug. 4, 2004, now Pat. No. 7,267,787, said application No. 10/948,764 is a continuation-in-part of application No. 10/912,741, said application No. 11/269,953 is a continuation-in-part of application No. 11/258,679, filed on Oct. 25, 2005, now Pat. No. 7,655,156.

(51) Int. Cl.
*H01L 33/00* (2010.01)

(52) U.S. Cl. ............ 252/301.4 F; 252/301.6 F; 362/29; 257/98; 313/503; 313/486; 313/487
(58) Field of Classification Search ............ 252/301.4 F, 252/301.6 F; 257/98; 313/503, 486, 487; 362/29
See application file for complete search history.

(56) References Cited

U.S. PATENT DOCUMENTS 2,297,108 A 9/1942 McKeag et al.
(Continued)

FOREIGN PATENT DOCUMENTS

JP 2003321675 A 11/2003
(Continued)

OTHER PUBLICATIONS

Toda et al., New Silicate Phosphors for a White LED, IEICE Transactions on Electronics, Oct. 10, 2006, vol. E89-C, No. 10, pp. 1406-1412; doi:10.1093/ietele/e89-c.10.1406, Copyright 2006 The Institute of Electronics, Information and Communication Engineers.

(Continued)

*Primary Examiner* — C. Melissa Koslow
(74) *Attorney, Agent, or Firm* — Fliesler Meyer LLP

(57) ABSTRACT

Novel green phosphors are disclosed having the comprise silicate-based compounds having the formula $(Sr,A_1)_x(Si,A_2)(O,A_3)_{2+x}:Eu^{2+}$, where $A_1$ is at least one divalent cation (a 2+ ion) including Mg, Ca, Ba, or Zn, or a combination of 1+ and 3+ cations; $A_2$ is a 3+, 4+, or 5+ cation, including at least one of B, Al, Ga, C, Ge, N, and P; $A_3$ is a 1−, 2−, or 3− anion, including F, Cl, Br, and S; and x is any value between 1.5 and 2.5, both inclusive. The formula is written to indicate that the $A_1$ cation replaces Sr; the $A_2$ cation replaces Si, and the $A_3$ anion replaces O. These green phosphors are configured to emit visible light having a peak emission wavelength greater than about 480 nm. They have applications in green illumination systems, red-green-blue backlighting systems, white LEDs, and plasma display panels (PDPs).

12 Claims, 17 Drawing Sheets

U.S. PATENT DOCUMENTS

| | | | | |
|---|---|---|---|---|
| 3,505,240 | A | 4/1970 | Barry | |
| 3,653,817 | A | 4/1972 | Liberman | |
| 3,732,416 | A | 5/1973 | Audesse et al. | |
| 6,093,346 | A | 7/2000 | Xiao et al. | |
| 6,190,577 | B1 | 2/2001 | Hase et al. | |
| 6,577,073 | B2* | 6/2003 | Shimizu et al. | 315/246 |
| 6,580,097 | B1* | 6/2003 | Soules et al. | 257/100 |
| 6,621,211 | B1 | 9/2003 | Srivastava et al. | |
| 6,649,946 | B2 | 11/2003 | Bogner et al. | |
| 6,686,691 | B1* | 2/2004 | Mueller et al. | 313/503 |
| 6,799,865 | B2 | 10/2004 | Ellens et al. | |
| 6,809,347 | B2 | 10/2004 | Tasch et al. | |
| 6,943,380 | B2 | 9/2005 | Ota et al. | |
| 7,045,826 | B2 | 5/2006 | Kim et al. | |
| 7,144,121 | B2 | 12/2006 | Minano et al. | |
| 7,157,746 | B2 | 1/2007 | Ota et al. | |
| 7,187,011 | B2 | 3/2007 | Tasch et al. | |
| 7,213,940 | B1 | 5/2007 | Van de Ven et al. | |
| 7,227,190 | B2 | 6/2007 | Yasukawa et al. | |
| 7,229,573 | B2 | 6/2007 | Setlur et al. | |
| 7,259,396 | B2 | 8/2007 | Tasch et al. | |
| 7,267,787 | B2 | 9/2007 | Dong et al. | |
| 7,286,296 | B2 | 10/2007 | Chaves et al. | |
| 7,291,289 | B2 | 11/2007 | Gotoh et al. | |
| 7,311,858 | B2* | 12/2007 | Wang et al. | 252/301.4 F |
| 7,390,437 | B2 | 6/2008 | Dong et al. | |
| 7,541,728 | B2* | 6/2009 | Wang et al. | 313/485 |
| 7,544,309 | B2 | 6/2009 | Juestel et al. | |
| 7,556,404 | B2 | 7/2009 | Nawashiro et al. | |
| 7,575,697 | B2* | 8/2009 | Li et al. | 252/301.4 F |
| 2002/0145685 | A1* | 10/2002 | Mueller-Mach et al. | 349/61 |
| 2003/0006702 | A1 | 1/2003 | Mueller-Mach et al. | |
| 2004/0056256 | A1 | 3/2004 | Bokor et al. | |
| 2004/0090174 | A1 | 5/2004 | Tasch et al. | |
| 2004/0227465 | A1 | 11/2004 | Menkara et al. | |
| 2004/0238792 | A1 | 12/2004 | Imanari et al. | |
| 2005/0179358 | A1 | 8/2005 | Soules et al. | |
| 2005/0200271 | A1 | 9/2005 | Juestel et al. | |
| 2005/0212397 | A1 | 9/2005 | Murazaki et al. | |
| 2005/0218780 | A1* | 10/2005 | Chen | 313/467 |
| 2005/0224828 | A1 | 10/2005 | Oon et al. | |
| 2005/0227569 | A1 | 10/2005 | Maeda et al. | |
| 2007/0125982 | A1 | 6/2007 | Tian et al. | |
| 2008/0018235 | A1* | 1/2008 | Wang et al. | 313/503 |
| 2008/0111472 | A1 | 5/2008 | Liu et al. | |
| 2008/0128735 | A1 | 6/2008 | Yoo et al. | |
| 2008/0151143 | A1* | 6/2008 | Li et al. | 349/68 |
| 2008/0315752 | A1 | 12/2008 | Rak et al. | |
| 2009/0059579 | A1 | 3/2009 | Shin et al. | |
| 2009/0101930 | A1 | 4/2009 | Li | |
| 2009/0152574 | A1 | 6/2009 | Wang et al. | |
| 2009/0168399 | A1 | 7/2009 | Kim et al. | |
| 2009/0180273 | A1 | 7/2009 | Kim et al. | |

FOREIGN PATENT DOCUMENTS

| | | | |
|---|---|---|---|
| TW | 546854 | * | 8/2003 |
| TW | 546854 B | | 8/2003 |
| WO | 03080763 | | 10/2003 |
| WO | WO 03/080763 | * | 10/2003 |
| WO | 03102112 | | 12/2003 |
| WO | 2004055910 | | 7/2004 |
| WO | WO 2004/055910 | * | 7/2004 |
| WO | 2004097949 | | 11/2004 |
| WO | 2006118389 | | 11/2006 |

OTHER PUBLICATIONS

Yoo et al., Control of Spectral Properties of Strontium-Alkaline Earth-Silicate-Europium Phosphors for LED Applications, J. Electrochem. Soc., vol. 152, Issue 5, pp. G382-G385 (2005).

Kang et al., Eu-doped barium strontium silicate phosphor particles prepared from spray solution containing NH4Cl flux y spray pyrolysic, Materials Science and Engineering B121 (2005), pp. 81-85, www.elsevier.com/locate/mseb.

Jang et al., Emission Band Change of (Sr1-xMx)3SiO5:Eu2+ (M=Ca, Ba) Phosphor for White Light Sources Using Blue/Near-Ultraviolet LEDs, J. Electrochem. Soc., vol. 156, Issue 6, pp. J138-J142 (2009).

Yu et al., Luminescent properties of Ca2SiO4:Eu3+ red phosphor for trichromatic white light emitting diodes, Journal of Rare Earths, vol. 26, No. 6, Dec. 2008, pp. 783-786.

Xie et al., A Simple, Efficient Synthetic Route to Sr2Si5N8:Eu2+-Based Red Phosphors for White Light-Emitting Diodes, Chem. Mater., 2006, 18(23), pp. 5578-5583, Oct. 19, 2006.

Cong et al., Characterization and Photoluminescence Properties of Eu3+ Doped 3CdO-Al2O3-8SiO2 Amorphous System for White Light-Emitting Diodes, J. Phys. Chem. C, 2009, 113(2), pp. 493-495, Dec. 19, 2008.

Bachmann et al., Color Point Tuning for (Sr,Ca,Ba)Si2O2N2:Eu2+ for White Light LEDs, Chem. Mater., 2009, 21(2), pp. 316-325, Dec. 29, 2008.

Luo et al., The Development of silicate matrix phosphors with broad excitation band for phosphor-convered white LED, Chinese Science Bulletin, vol. 53, No. 19, Oct. 2008, pp. 2923-2930.

Kijima et al., New Green and Red Phosphors for White LEDs, Journal of Light & Visual Environment, vol. 32, No. 2, 2008, pp. 202-207.

Ryu et al., Synthesis of Eu x Si6-z Al z O z N8-z green phosphor and its luminescent properties, Applied Physics A: Materials Science & Procesing, vol. 95, No. 3, Jun. 2009, pp. 747-752.

Sun et al., Pulsed laser deposition of silicate phosphor thin films, Applied Physics A: Materials Science & Processing, vol. 69, Supp. 1, Dec. 1999, pp. S39-S43.

Ma et al., The Origin of 505 nm-Peaked Photoluminescence from Ba3MgSi2O8:Eu2+, Mn2+ Phosphor for White-Light-Emitting Diodes, Electrochem. Solid-State Lett., vol. 11, Issue 2, pp. E1-E4 (2008).

Shen et al., Synthesis and luminous characteristics of Ba2MgSi2-xAlxO7:0.1Eu2+,0.1Mn2+ phosphor for WLED, State Key Laboratory of Modern Optical Instrumentation, Zhejiang University, Hangzhou 310027, China and Optical Engineering, China Jiliang University, Hangzhou 310018, China, received Dec. 6, 2007, accepted May 10, 2008, available online Aug. 9, 2008, http://www.sciencedirect.com, 6 pages.

* cited by examiner

SILICATE-BASED GREEN PHOSPHORS IN RED-GREEN-BLUE (RGB) BACKLIGHTING AND WHITE ILLUMINATION SYSTEMS

PRIORITY CLAIM

The present application is a continuation of U.S. patent application Ser. No. 11/269,953, filed Nov. 8, 2005, which issued Aug. 18, 2009 as U.S. Pat. No. 7,575,697 titled "Silicate-Based Green Phosphors", by Yi-Qun Li et al., which is a continuation-in-part of U.S. patent application Ser. No. 11/100,103, titled "Novel silicate-based yellow-green phosphors," filed Apr. 5, 2005, now abandoned, which was a continuation-in-part of U.S. patent application Ser. No. 10/948,764, filed Sep. 22, 2004, now U.S. Pat. No. 7,311,858, issued Dec. 25, 2007. The Ser. No. 11/100,103 and the Ser. No. 10/948,764 are each a continuation-in-part of U.S. patent application Ser. No. 10/912,741, filed Aug. 4, 2004, titled "Novel phosphor systems for a white light emitting diode (LED)," now U.S. Pat. No. 7,267,787, issued Sep. 11, 2007. U.S. patent application Ser. No. 11/269,953 is also a continuation-in-part of U.S. patent application Ser. No. 11/258,679, titled "Silicate-based Orange Phosphors," filed Oct. 25, 2005. Application Ser. Nos. 11/100,103, 10/912,741, 10/948,764, and 11/258,679 are hereby incorporated by reference in their entirety.

FIELD OF THE INVENTION

Embodiments of the present invention are directed in general to the fluorescence of $Eu^{2+}$-activated silicates configured to emit in the green region of the electromagnetic spectrum. The present green phosphors may be used, amongst other applications, in green illumination systems, plasma display panels (PDPs), white illumination systems (white LEDs), and red-green-blue (RGB) illumination systems.

BACKGROUND

White LEDs are known in the art, and they are relatively recent innovations. It was not until LEDs emitting in the blue/ultraviolet region of the electromagnetic spectrum were developed that it became possible to fabricate a white light illumination source based on an LED. Economically, white LEDs have the potential to replace incandescent light sources (light bulbs), particularly as production costs fall and the technology develops further. In particular, the potential of a white light LED is believed to be superior to that of an incandescent bulb in lifetime, robustness, and efficiency. For example, white light illumination sources based on LEDs are expected to meet industry standards for operation lifetimes of 100,000 hours, and efficiencies of 80 to 90 percent. High brightness LEDs have already made a substantial impact on such areas of society as traffic light signals, replacing incandescent bulbs, and so it is not surprising that they will soon provide generalized lighting requirements in homes and businesses, as well as other everyday applications.

There are several general approaches to making a white light illumination system based on light emitting phosphors. To date, most white LED commercial products are based on the approach shown in FIG. 1A, where light from a radiation source contributes directly to the color output of the white light illumination (in addition to providing excitation energy to a phosphor). Referring to the system 10 of FIG. 1A, a radiation source 11 (which may be an LED) emits light 12, 15 in the visible portion of the electromagnetic spectrum. Light 12 and 15 is the same light, but is shown as two separate beams for illustrative purposes. A portion of the light emitted from radiation source 11, light 12, excites a phosphor 13, which is a photoluminescent material capable of emitting light 14 after absorbing energy from the radiation source 11. The light 14 can be a substantially monochromatic color in the yellow region of the spectrum, or it can be a combination of green and red, green and yellow, or yellow and red, etc. Radiation source 11 also emits blue light in the visible that is not absorbed by the phosphor 13; this is the visible blue light 15 shown in FIG. 1A. The visible blue light 15 mixes with the yellow light 14 to provide the desired white illumination 16 shown in the figure.

Alternatively, a newer approach to making a white light illumination system has been to use non-visible radiation sources that emit light in the ultra-violet (UV) portion of the spectrum. This concept is illustrated generally at 20 in FIG. 1B, which illustrates an illumination system comprising a radiation source that emits in the non-visible such that the light coming from the radiation source does not contribute substantially to the light produced by the illumination system. Referring to FIG. 1B, substantially non-visible light is emitted from radiation source 21 as light 22, 23. Light 22 has the same characteristics as light 23, but the two different reference numerals have been used to illustrate the following point: light 22 may be used to excite a phosphor, such as phosphor 24 or 25 to make photoluminescent light 26, 27, respectively, but the light 23 emitted from the radiation source 21 which does not impinge on a phosphor does not contribute to the white light output 28 from the phosphor(s) because light 23 is substantially invisible to the human eye.

Red-green-blue (RBG) backlighting systems are known in the art, as illustrated schematically in FIG. 2A. These conventional systems use a separate LED chip for each of the three colors needed for the backlighting system: red, green, and blue. The conventional RBG system of FIG. 2A employs a red LED 20 for providing red light 20L, a green LED 21 for providing green light 21L, and a blue LED 22 for providing blue light 22L. The disadvantages of such a system are that each LED requires an electrical current controller, so that three current controllers are needed for the system of FIG. 2A.

What is needed in the art is an improved green phosphor for use in white light illumination systems, single-color green illumination systems and illumination systems based on the present green phosphor, which may comprise a combination of a blue LED and/or UV LED chip; combinations of the present green phosphor with UV chips and with blue emitting chips; improved green phosphors in a plasma display panel, and the novel green phosphors in RGB backlighting systems, such that the number of current controllers controlling current to the LED chips is reduced.

SUMMARY OF THE INVENTION

Embodiments of the present invention are directed in general to the fluorescence of $Eu^{2+}$-activated silicates configured to emit in the green region of the spectrum for use in white light illumination systems (e.g., white LEDs), single-color light emitting systems (e.g., green and/or cyan), in plasma display panels (PDPs), and in red-green-blue (RGB) backlighting systems.

In particular is disclosed a silicate-based green phosphor having the formula $(Sr,A_1)_x(Si,A_2)(O,A_3)_{2+x}:Eu^{2+}$, where:

$A_1$ is at least one of a divalent, 2+ alkaline earth or transition metal cation, selected from the group consisting of Mg, Ca, Ba, Zn, where the stoichiometric amount of $A_1$ varies from 0.3 to 0.8, both inclusive;

$A_2$ is P;

$A_3$ is a halogen anion selected from the group consisting of F and Cl;

where the amounts of $A_2$ and $A_3$ each range from 0 to 19 mole percent, both endpoints inclusive; and x is any value between 1.5 and 2.5, both inclusive.

The formula is written to indicate that the $A_1$ cation(s) replace strontium (Sr); the $A_2$ cation(s) replace silicon (Si); and the $A_3$ anion(s) replace oxygen (O). In the case where $A_1$ is a combination of substantially equal numbers of 1+ and 3+ cations, this overall charge is averaged such that it is substantially equal to that achieved by the same number of 2+ cations. In the silicate-based green phosphors of the present embodiments x may have any value greater than or equal to about 1.5 and less than about 2.0, or x may be any value greater than about 2.0, and less than about 2.5. In some embodiments, x is not 2.

In an alternative embodiment, an illumination system of the present invention comprises a silicate-based green phosphor having the formula $(Sr,A_1)_x(Si,A_2)(O,A_3)_{2+x}:Eu^{2+}$, where $A_1$ is at least one of a divalent, 2+ cation; $A_2$ is a 3+, 4+, or 5+ cation; $A_3$ is a 1−, 2−, or 3− anion; and x is any value between 1.5 and 2.5, inclusive; a silicate-based orange phosphor having the formula $(Sr,A_1)_x(Si,A_2)(O,A_3)_{2+x}:Eu^{2+}$, where $A_1$ is at least one of a divalent, 2+ cation; $A_2$ is a 3+, 4+, or 5+ cation; $A_3$ is a 1−, 2−, or 3− anion; and x is any value between 2.5 and 3.5, inclusive; and a radiation source for providing excitation radiation to the green phosphor and the orange phosphor.

The utility of the present silicate-based green phosphors include, but are not limited to, white light illumination systems (so called, "white LEDs), substantially single colored light emitting systems, such as green or cyan illumination systems, red-green-blue (RGB) backlighting systems, and plasma display panels (PDPs).

Figure 12:
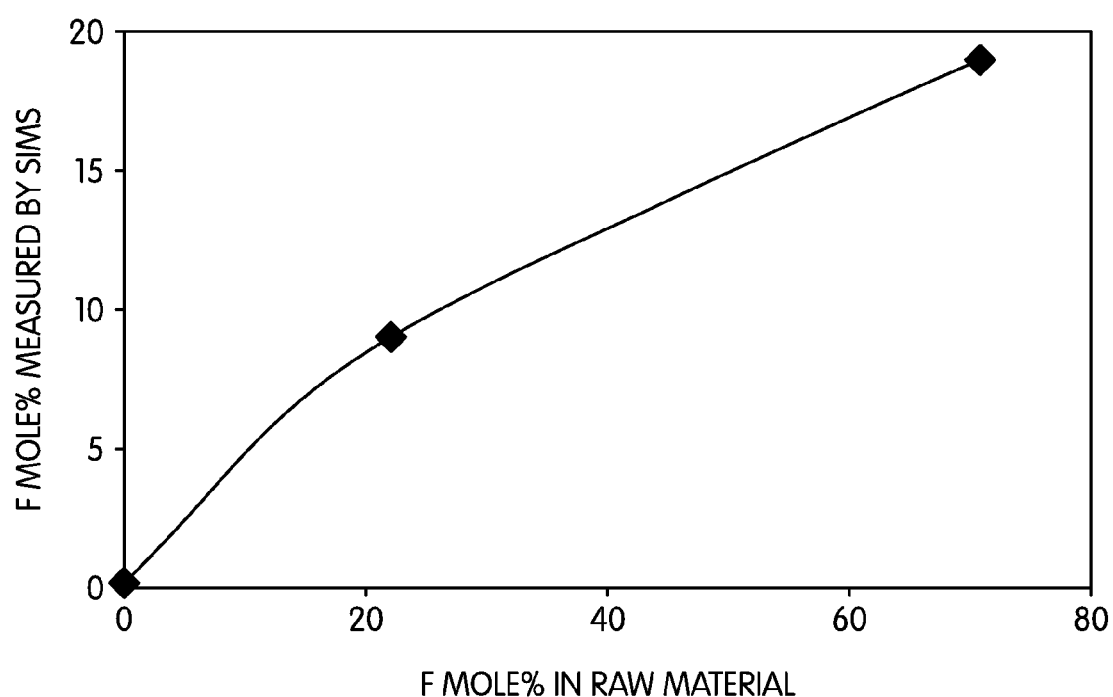
FIG. 12 relates to fabrication of the present green phosphors in the case when $A_3$ is fluorine, and is a graph of the fluorine concentration of a starting material in an exemplary sintered phosphor as a function of the mole percent of fluorine that actually ends up in the phosphor, the fluorine content in the sintered phosphor measured by secondary ion emission spectroscopy (SIMS)
Figure 15:
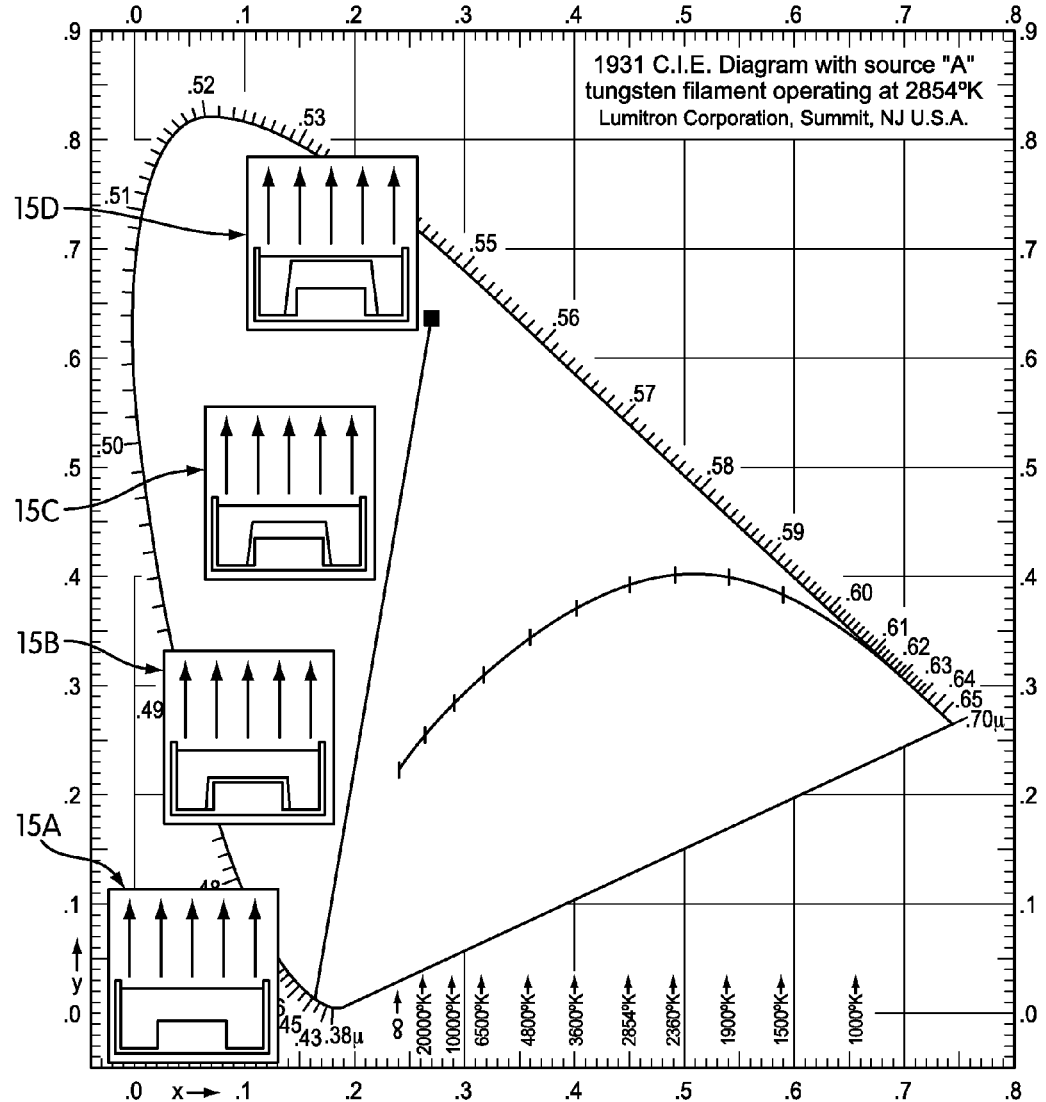
Figure 16:
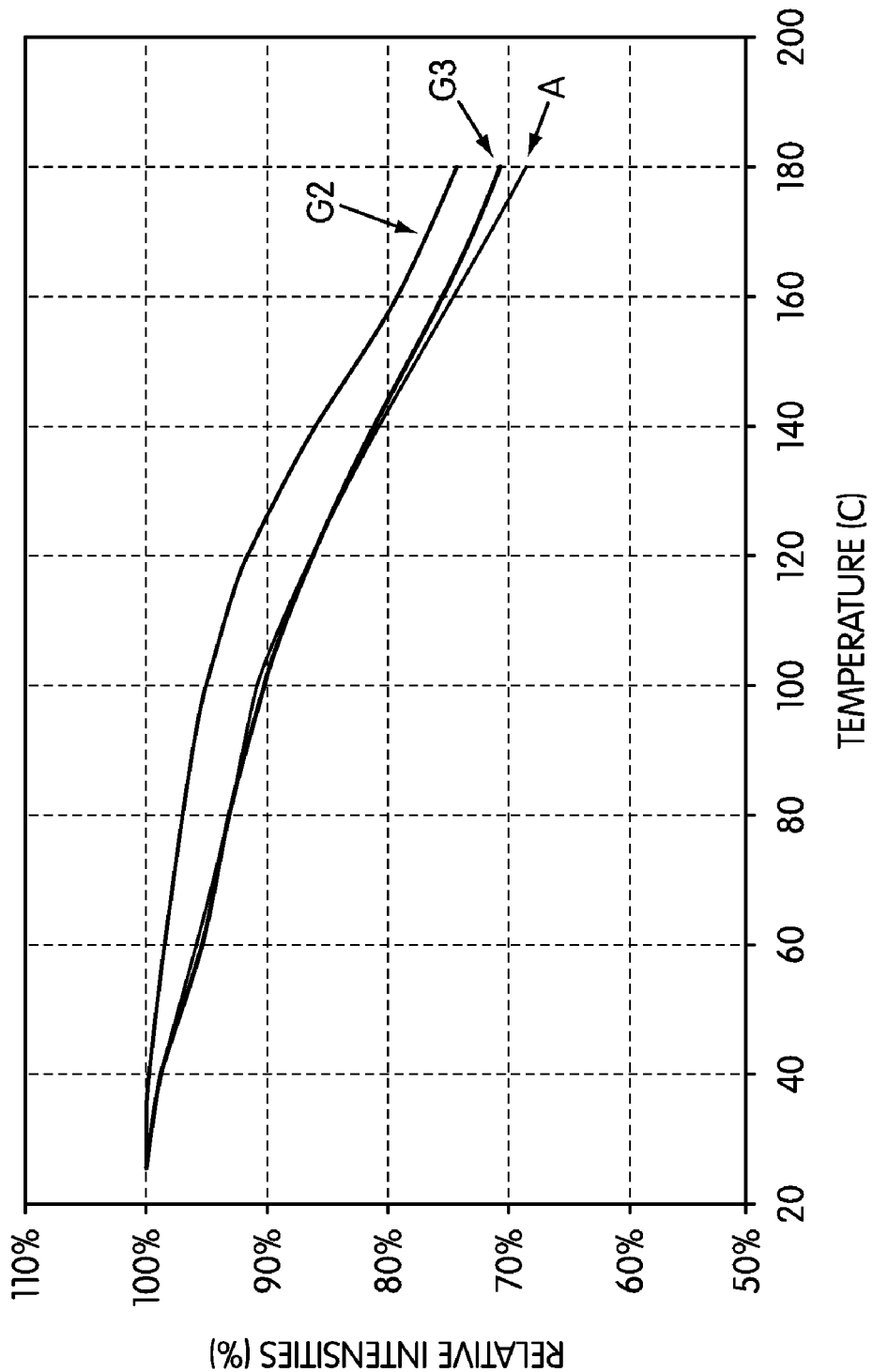

showing the enhanced brightness that may be realized with the phosphor-containing systems relative to the green LED chip;

FIG. 14 shows emission spectra for another exemplary phosphor-containing, green light emitting system (again using a non-visible UV LED excitation source), this time with the concentration of the exemplary silicate-containing phosphor varied at two levels to show the effect of the output of the systems in the blue;

FIG. 15 is a schematic that shows, in a different way than that of FIG. 12, how varying concentration of any of the present green phosphors may be used in conjunction with a blue LED chip (which emits visible blue light) to obtain colors other than green (such as a green-blue or cyan color); these colors have been plotted on a CIE diagram as a function of the phosphor concentration (schematically); and FIG. 16 is a graph of the maximum intensity of an exemplary green phosphor measured at different temperatures, and plotted with data from a YAG:Ce compound for comparison.

DETAILED DESCRIPTION OF THE INVENTION

Various embodiments of the present invention will be described herein. These embodiments include the use of the present silicate-based green phosphors in green illumination systems, red-green-blue (RGB) backlighting system, white light illumination systems, and plasma display panels (PDPs). The present disclosure will include a general description of the phosphor, give exemplary emission and excitation spectra, and discuss the effect of including a particular alkaline earth element. The effect of including the $A_3$ anion will be discussed, with particular emphasis on the effect when $A_3$ is fluorine. After that, the effect of varying the concentration of the silicate-based green phosphor will be discussed, mostly for the case of a green illumination system, although it will be understood that this applies to RBG backlighting systems, white light illumination systems, and plasma display panels as well. The effect of concentration on the position of the green phosphor in a CIE diagram will also be discussed. Finally, the effects of temperature on phosphor emission intensities will be given.

Exemplary Utilities of the Present Green Phosphors

Figure 1A:
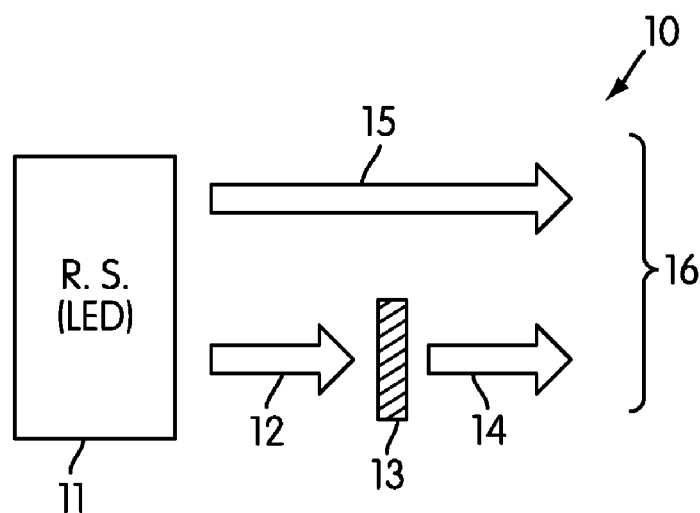
FIG. 1A is a schematic representation of a general scheme for constructing a white light illumination system, the system comprising a radiation source that emits in the visible, and a phosphor that emits in response to the excitation from the radiation source, wherein the light produced from the system is a mixture of the light from the phosphor and the light from the radiation source.
Figure 1B:
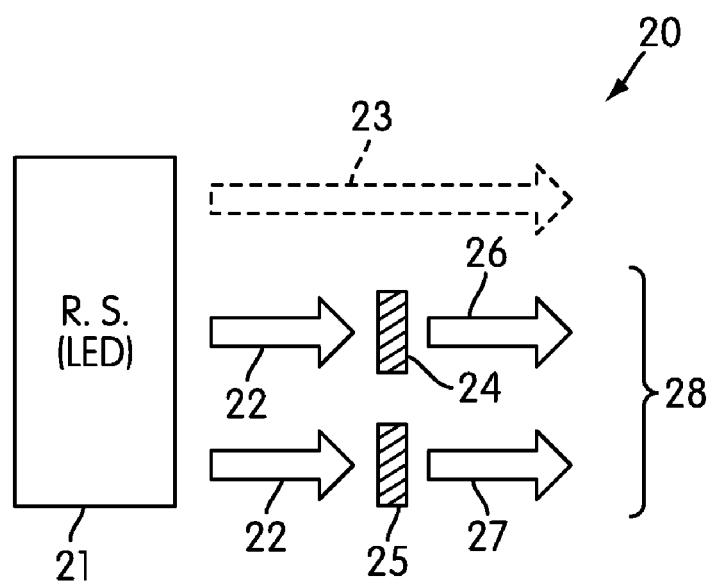
FIG. 1B is a schematic representation of a white light illumination system comprising a radiation source that emits in the non-visible such that the light coming from the radiation source does not contribute substantially to the white light produced by the system.
Figure 2A:
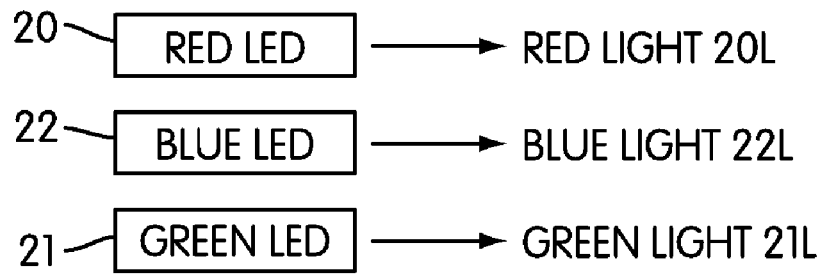
FIG. 2A is a schematic representation of a prior art scheme for constructing a red-green-blue (RGB) backlighting system using a red LED for providing the red light, a blue LED for providing the blue light, and a green LED for providing the green light.

The conventional RBG backlighting system has already been discussed with reference to FIG. 2A. It will be noted again that this system employs three light emitting diodes (LEDs), which are semiconductor integrated circuits (or "chips,"). There is one LED for each of the red, green, and blue light sources in FIG. 2A. One disadvantage of such a prior art system is that an electrical current controller is needed for each of the LEDs, and it is known in the art that the fewer the current controllers, the better. The prior art system of FIG. 2A requires three circuit controllers.

Figure 2B:
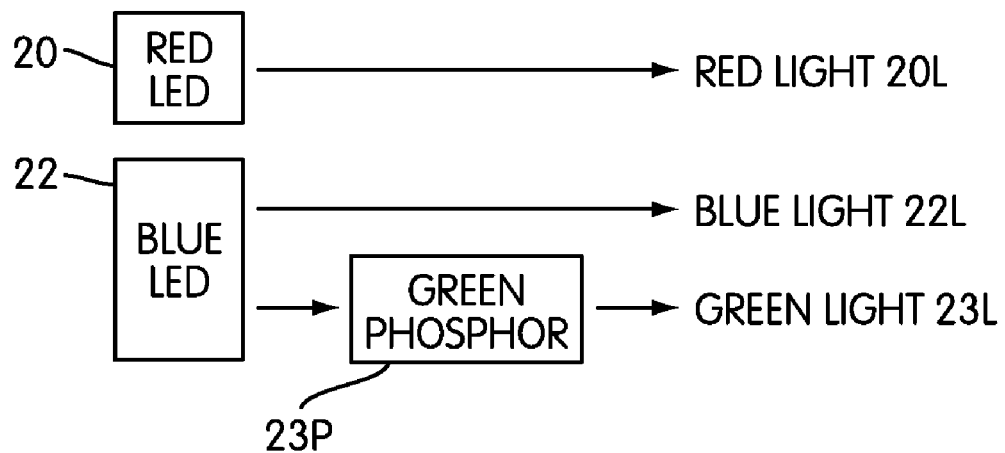
FIG. 2B is a schematic representation of a novel RGB backlighting system using a red LED for providing the red light, and a blue LED for providing the blue light and for providing excitation radiation to a green phosphor, the green phosphor providing the green light.

In contrast, the novel RBG system of FIG. 2B employs a red LED 20 to produce red light 20L, and a blue LED 22 to provide blue light 22L (just as for the conventional case). But the green LED 21 of FIG. 2A has been replaced by the green phosphor 23P, which is excited by the blue LED 22. In other words, of that radiation emitted by the blue LED 22, a portion contributes to the overall output of the RGB system (blue light 22L), and the remainder excites green phosphor 23P to make green light 23L. The RGB system of FIG. 2B requires only two electrical current controllers; one for red LED 20, and one for blue LED 22.

Figure 2C:
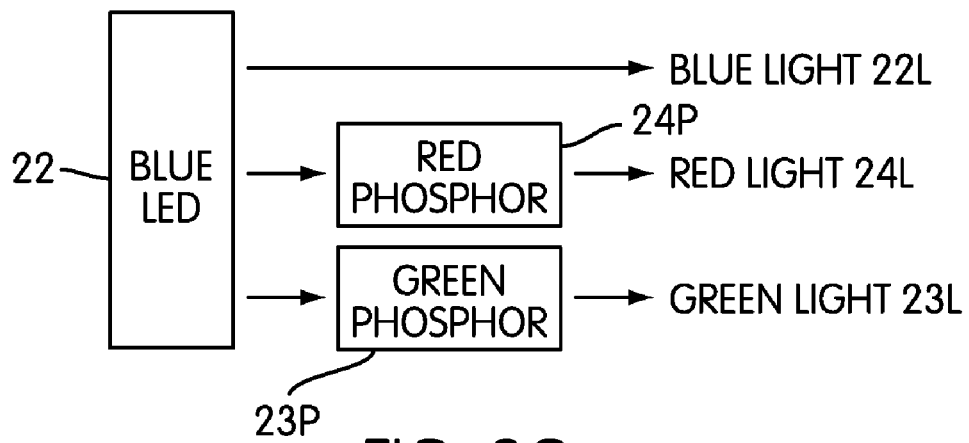
FIG. 2C is a schematic representation of a novel RGB backlighting system using a blue LED for providing the blue light and for providing excitation radiation to red and green phosphors; the red phosphor providing the red light and the green phosphor providing the green light.

An alternative RGB system that only requires one current controller is shown in FIG. 2C. The blue LED 22 still provides the blue light 22L and is used to excite the green phosphor 23P, as in the system of FIG. 2B, but in this case it also excites a red phosphor 24P. The red phosphor 24P produces red light 24L. Only one electrical current controller is needed for the system of FIG. 2C because there is only one LED in the system (blue LED 22).

Figure 2D:
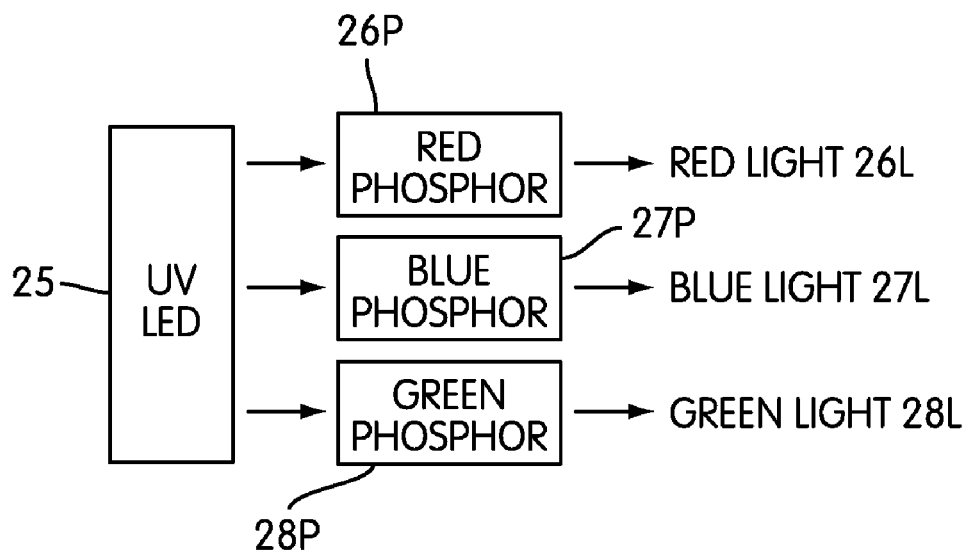
FIG. 2D is a schematic representation of a novel RGB backlighting system using a UV LED that does not provide any substantial visible light, but instead provides excitation radiation to red, green, and blue phosphors, each emitting red, green, and blue light, respectively.

Another configuration of an RBG system that only requires one current controller is shown in FIG. 2D. This system uses a radiation source that emits in the ultra-violet (UV), and thus the radiation coming from UV LED 25 is substantially non-visible. In order to provide the blue portion of the RBG system, a blue phosphor 27P is used to provide blue light 27L. Referring to FIG. 2D, the UV LED 25 provides excitation radiation to the red phosphor 26P to produce red light 26L. It also provides excitation radiation to the green phosphor 28P to produce green light 28L.

Figure 3A:
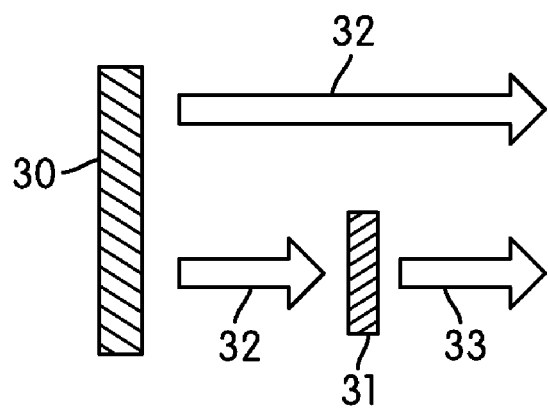
FIGS. 3A and 3B are schematic representations of green illumination systems in which the present silicate-based green phosphors may be utilized.
Figure 3B:
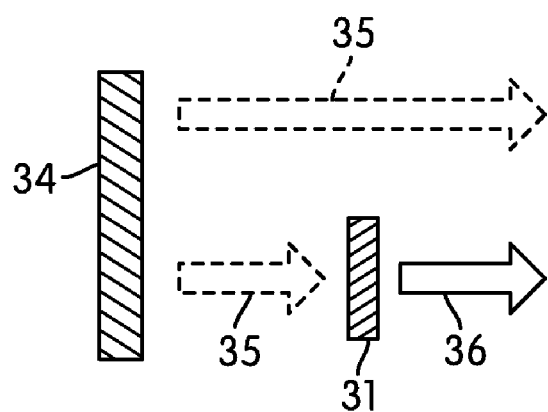

An exemplary green illumination system is shown in FIGS. 3A and 3B. As part of a green illumination system, the present silicate-based green phosphors may be excited by either blue LED chips that emit visible blue light, or UV LED chips that emit excitation radiation that is substantially non-visible.

The green illumination system of FIG. 3A utilizes a blue chip 30 to excite a silicate-based green phosphor 31 with excitation radiation (e.g., visible blue light) 32. The green phosphor gives off green light 33. Light from the green illumination system of FIG. 3A comprises both blue light 32 and green light 33. The conversion of blue light 32 to green light 33 by the green phosphor 31 is dependent in part on the amount of the excitation light 32 that is absorbed by the green phosphor 31.

Alternatively, the green illumination may comprise a UV LED 34, as illustrated in FIG. 3B. Here, substantially non-visible radiation 35 is used to excite the green phosphor 31. Again, the efficiency of conversion is determined by the percentage of absorption of UV light 35 by the green phosphor 31. In this case, however, the green light 36 that emits from the green illumination system of FIG. 3B is composed entirely of the light emitted from the green phosphor 31, as the excitation illumination 35 is substantially non-visible.

Figure 4:
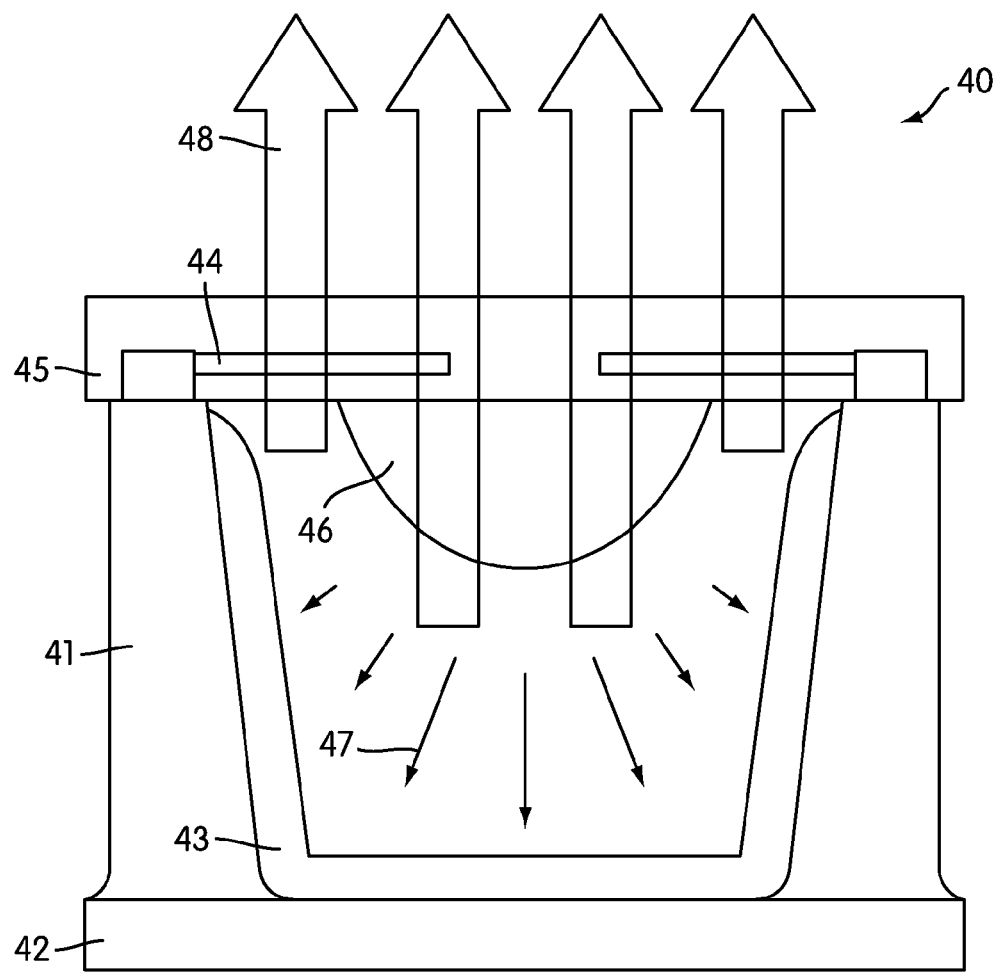
FIG. 4 is a schematic representation of a plasma display panel in which the present silicate-based green phosphors may be utilized.

The present silicate-based green phosphors may be used in plasma display panels (PDPs), one pixel 40 of which is illustrated schematically in FIG. 4. Referring to FIG. 4, the pixel of a typical plasma display panel comprises a structural rib 41 positioned on supporting back glass 42, with the novel silicate-based green phosphor 43 deposited within a well formed by the rib 41 and the back glass 42. At the top of the structure is a transparent electrode 44 embedded within front glass 45. Generated by the transparent electrode 44 is a plasma 46, generating VUV radiation 47, which serves as the excitation source for any of the instant green phosphors 43. Upon excitation, green phosphor 43 emits visible light 48.

The Novel Silicate-Based Green Phosphors of the Present Embodiments

Embodiments of the present invention are directed in general to the fluorescence of $Eu^{2+}$-activated silicates configured to emit in the green region of the spectrum for use in substantially single-colored illumination systems, RBG backlighting systems, plasma display panels (PDPs), and white light illumination systems (e.g., white light emitting diodes).

In particular, the green phosphors of the present invention comprise silicate-based compounds have the formula $(Sr,A_1)_x(Si,A_2)(O,A_3)_{2+x}:Eu^{2+}$, where $A_1$ is at least one divalent cation (a 2+ ion) including magnesium (Mg), calcium (Ca), barium (Ba), or zinc (Zn), or a combination of 1+ and 3+ cations, wherein the 1+ cations may include K, Na, and Li, and wherein the 3+ cations may include Cs, Y, Ce, Bi, and Li. The $A_1$ cation(s) component may comprise a combination of some 2+ cations and a substantially equal number of 1+ and 3+ cations.

$A_2$ is a 3+, 4+, or 5+ cation, including at least one of boron (B), aluminum (Al), gallium (Ga), carbon (C), germanium (Ge), and phosphorus (P).

$A_3$ is a 1−, 2−, or 3− anion, including fluorine (F), chlorine (Cl), bromine (Br), nitrogen (N), and sulphur (S).

The value of x is any integer or non-integer between 1.5 and 2.5, both inclusive. In one embodiment of the invention, x is not 2. The formula is written to indicate that the $A_1$ cation replaces strontium (Sr); the $A_2$ cation replaces silicon (Si), and the $A_3$ anion replaces oxygen (O). In one embodiment of the present invention, $A_3$ may be sulphur (S) and there may be little or no oxygen in the compound, such that the phosphor is substantially a sulfide rather than an oxide.

As taught by G. Blasse et al. in Philips Research Reports Vol. 23, No. 1, pp. 1-120, the crystal structure of a β-$Ca_2SiO_4$: Eu, $Sr_2SiO_4$:Eu, or $Ba_2SiO_4$:Eu composition, with $Eu^{2+}$ at a concentration of 2 atomic percent, is $K_2SO_4$-like. Thus, it is contemplated that the present silicate-based green phosphors have a similar host lattice.

Effect of the Alkaline Earth Component

The optical properties of the inventive green phosphors may be controlled, among other methods, by adjusting the ratio of the $A_1$ cation to the strontium, where $A_1$ may be an alkaline earth element such as magnesium (Mg), calcium (Ca), barium (Ba), or a transition metal element, such as zinc (Zn), or any combination or combinations thereof. An exemplary data set that puts this embodiment of the inventive concept into place is illustrated in FIG. 5.

Figure 5:
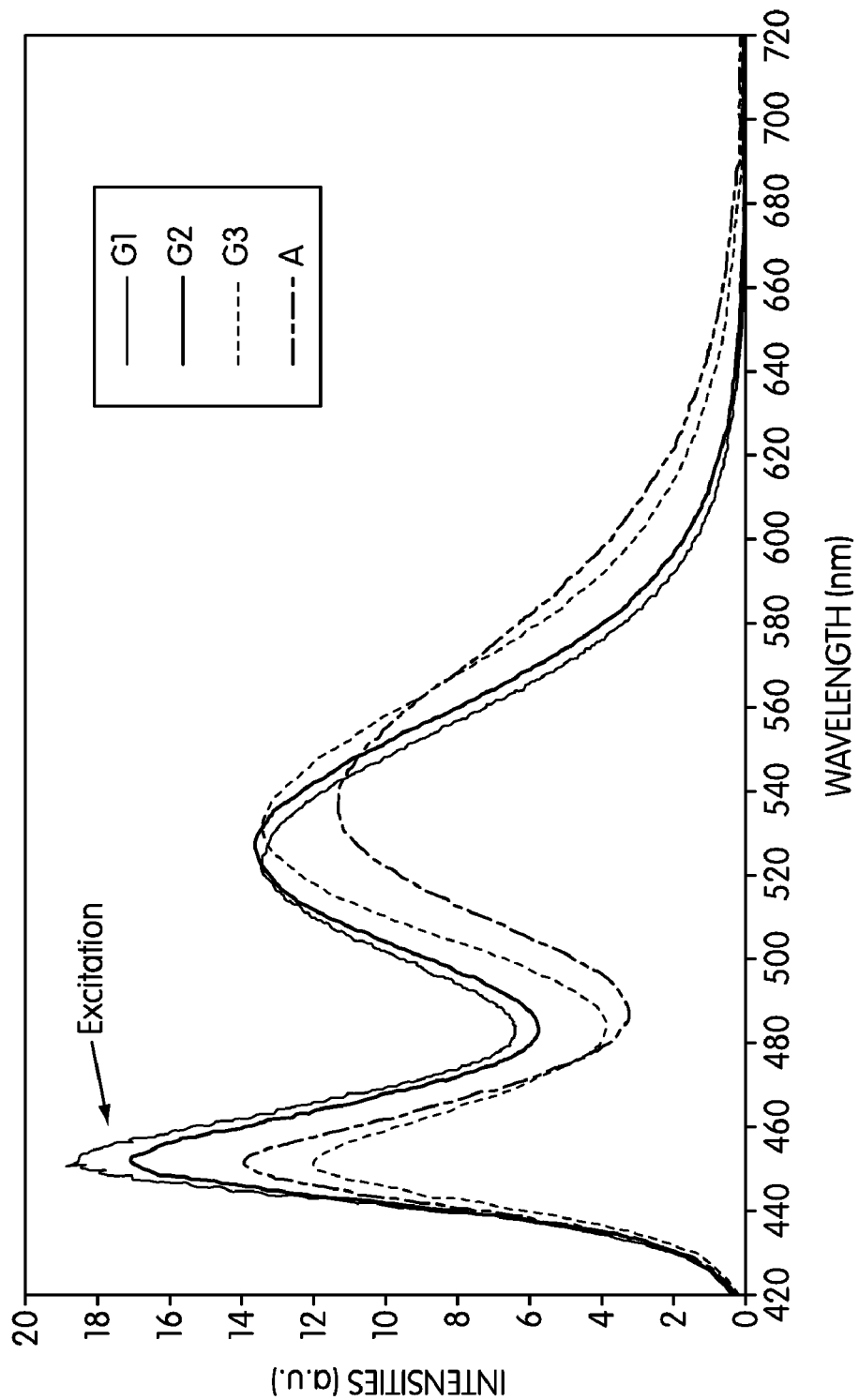
FIG. 5 shows a collection of emission spectra for exemplary green-silicate phosphors in a family of increasing Ba content relative to the Sr content, such as the phosphors emit increasingly in the green and less in the yellow; the phosphors having the formulas $(Sr_{0.7}Ba_{0.3})_2SiO_4:Eu^{2+}F^-$; $(Sr_{0.4}Ba_{0.6})_2SiO_4:Eu^{2+}F^-$; $(Sr_{0.3}Ba_{0.7})_2SiO_4:Eu^{2+}F^-$; and $(Sr_{0.2}Ba_{0.8})_2SiO_4:Eu^{2+}F^-$; the phosphors emitting at 540, 532, 525, and 522 nm, respectively.

FIG. 5 is a collection of emission spectra for a family of exemplary compositions having the formula $(Sr_{1-y}Ba_y)_2SiO_4$:$Eu^{2+}$F, such that $A_1$ in the general formula $(Sr,A_1)_x(Si,A_2)(O,A_3)_{2+x}$:$Eu^{2+}$ is Ba; and $A_3$ is F (note that there was no $A_2$ cation in this series of tests). Specifically, the emission spectra of three green phosphors having the formulas $(Sr_{0.2}Ba_{0.8})_2SiO_4$:$Eu^{2+}$F, which emits at about 522 nm and shown as curve "G1"; $(Sr_{0.3}Ba_{0.7})_2SiO_4$:$Eu_{2+}$F, which emits at about 525 nm and shown as curve "G2"; and $(Sr_{0.4}Ba_{0.6})_2SiO_4$:$Eu_{2+}$F, which emits at about 532 nm and shown as curve "G3", were compared to the emission spectra of a phosphor that emits more in the yellow region of the spectra, the yellow silicate-based phosphor having the formula $(Sr_{0.7}Ba_{0.3})_2SiO_4$:$Eu_{2+}$F. The yellow phosphor emits at about 540 nm and is shown as curve "A". The phosphors were excited with a blue LED emitting at about 450 nm, which peak also shows up in the emission spectra of FIG. 5.

Referring to FIG. 5, one skilled in the art will note that the three green phosphors emit with an intensity which is about 20 percent more intense than the yellow phosphor. The present inventors have discovered in previous studies that the wavelength position at which the peak emission occurs changes in a $(Sr_{1-x}Ba_x)_2SiO_4$ phosphor system from a green at 500 nm for x=1 (in other words, when the alkali metal content is 100 percent Ba) to a yellow at 580 nm when x=0 (100 percent Sr). The conversion efficiency from the same light source at 450 nm shows a continuous increase when the Ba increases from 0 to about 90%. The peak emission wavelength of 545 nm obtained when the Ba to Sr ratio is 0.3 to 0.7 is close to that of a YAG:Ce peak emission wavelength.

Figure 6:
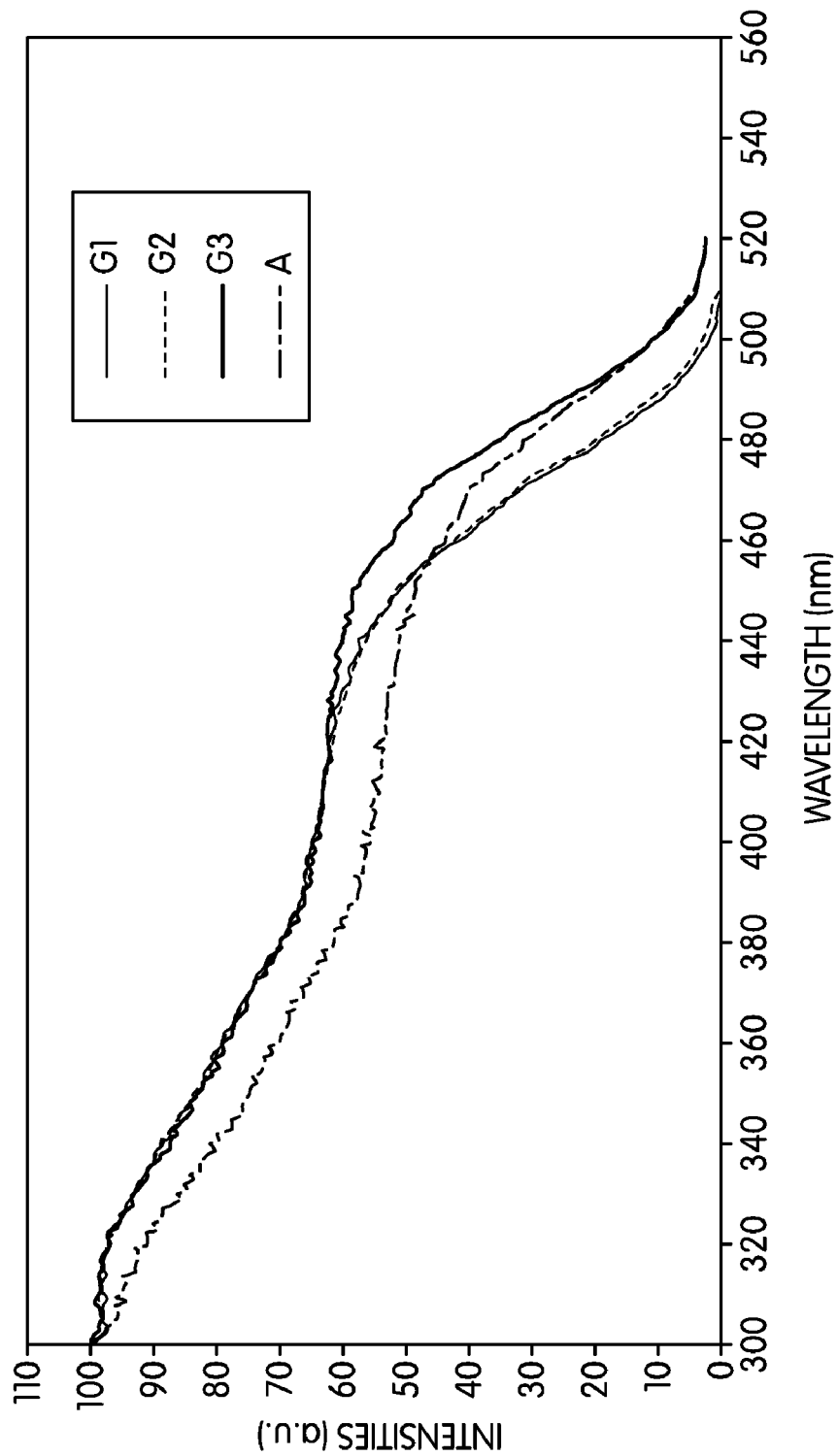
FIG. 6 shows a collection of excitation spectra for the same exemplary phosphors described in FIG. 3.

A family of excitation spectra for the same four phosphors $(Sr_{0.2}Ba_{0.8})_2SiO_4$:$Eu^{2+}$F, $(Sr_{0.3}Ba_{0.7})_2SiO_4$:$Eu^{2+}$F, $(Sr_{0.4}Ba_{0.6})_2SiO_4$:$Eu^{2+}$F, and $(Sr_{0.7}Ba_{0.3})_2SiO_4$:$Eu^{2+}$F is shown in FIG. 6. It will be understood by one skilled in the art that an "excitation spectrum" is actually an emission spectrum, where the intensity of the light emitted is measured as a function of the wavelength of the excitation radiation. In other words, a particular wavelength is picked at which to measure the light emitted from the phosphor, and it is the wavelength of the radiation incoming to the phosphor which is scanned. The wavelength that was chosen in this series of experiments is the wavelength at which the most intense emission occurred when the phosphors were excited at 450 nm.

In the particular examples of FIG. 6, the detector used in the experiment was set to measure the intensity of 522 nm light emitted by the $(Sr_{0.2}Ba_{0.8})_2SiO_4$:$Eu^{2+}$F phosphor, since that was the wavelength at which the most intense emission occurred when the $(Sr_{0.2}Ba_{0.8})_2SiO_4$:$Eu^{2+}$F phosphor had been excited at 450 nm (see FIG. 5). Once the detector had been set to 522 nm, the wavelength of the excitation radiation was scanned from about 300 to about 560 nm, and the emission at 522 nm recorded. Likewise, the detector was set to measure the intensity of 525 nm, 532 nm, and 540 nm light for the $(Sr_{0.3}Ba_{0.7})_2SiO_4$:$Eu_{2+}$F, $(Sr_{0.4}Ba_{0.6})_2SiO_4$:$Eu^{2+}$F, and $(Sr_{0.7}Ba_{0.3})_2SiO_4$:$Eu^{2+}$F phosphors, respectively, and the wavelength of the excitation radiation scanned from about 300 to about 560 nm for each sample.

The data in FIG. 6 shows that the three green phosphors (emitting at 522 nm, curve G1, 525 nm, curve G2, and 532 nm, curve G3) are more responsive to the excitation radiation when the excitation radiation has a wavelength less than about 420 nm. Between about 420 and 460 nm, the curves for the 522 and 525 nm green phosphors drop below both the 532 green phosphor and the 540 yellow phosphor shown as curve "A". None of the four phosphors are responsive to excitation radiation having a wavelength greater than about 500 to 520 nm.

Elements other than Ba may be used to substitute for Sr in the phosphors; these alternative elements include Ca and Mg. Calcium substitution of barium or strontium in a Sr—Ba based silicate phosphor system will in general reduce the emission intensity of the phosphor, moving the emission to longer wavelength when calcium substitution is less than 40 percent. Large amounts of magnesium substitution of either barium or strontium in Sr—Ba based silicate phosphors will in general reduce emission intensity and move the emission to shorter wavelengths. However, small amounts of magnesium substitution of barium or strontium (for example, less than 10 percent) will enhance the emission intensity and move the emission to longer wavelengths.

Figure 7:
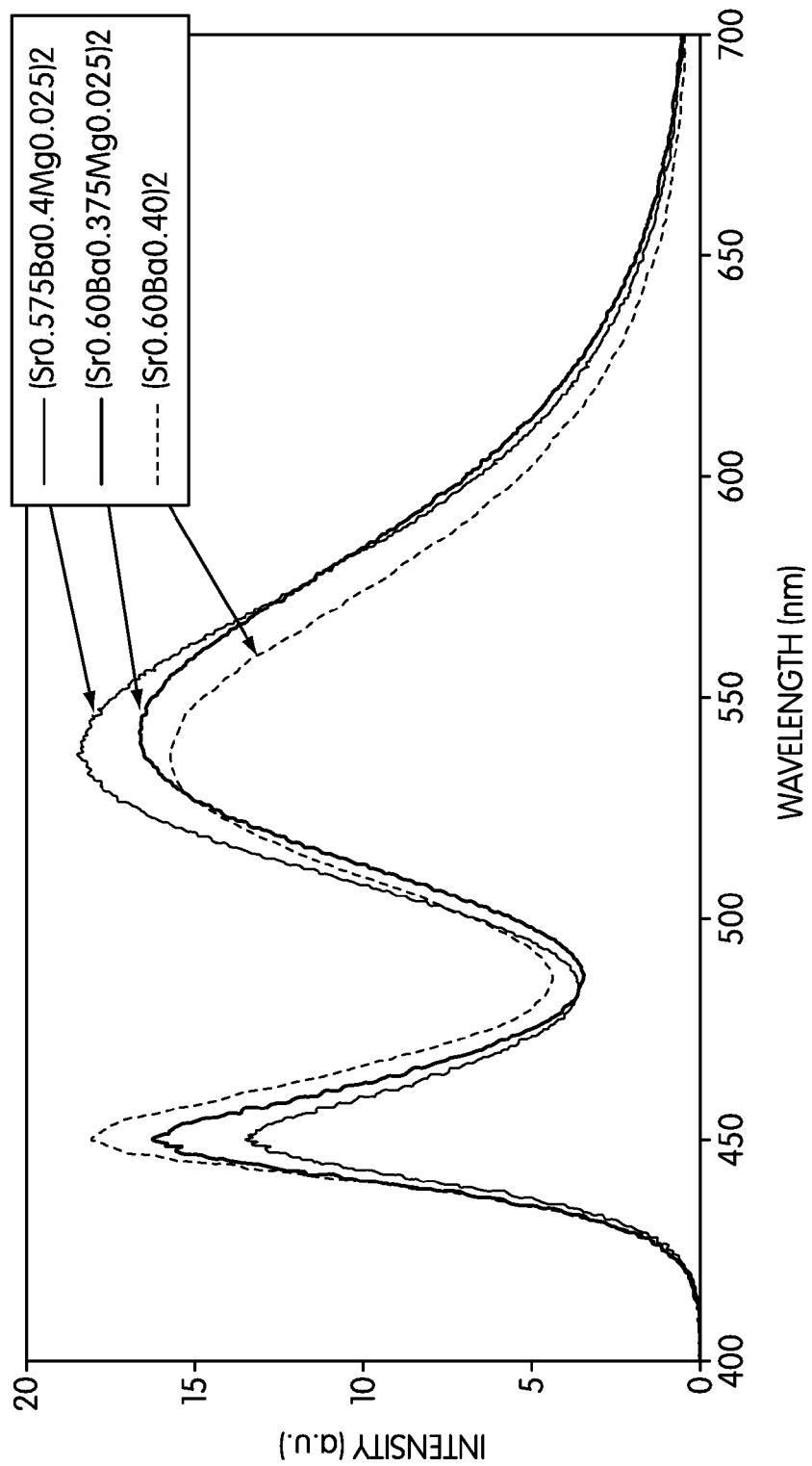
FIG. 7 is a graph of the emission spectra of a series of the present phosphors showing the effect of substituting Mg for first Sr and then Ba in an exemplary silicate-based green phosphor of the present embodiments, the phosphor having the formula $(Sr_{0.6}Ba_{0.4})_2SiO_4:Eu^{2+}F^-$.

The effect of small amounts of Mg addition to the present silicate-based green phosphors is shown in FIG. 7. In FIG. 7, the emission of the phosphors $(Sr_{0.057}Ba_{0.4}Mg_{0.025})_2SiO_4$:$Eu^{2+}$F and $(Sr_{0.057}Ba_{0.4}Mg_{0.025})_2SiO_4$:$Eu^{2+}$F under 450 nm excitation was measured and compared to the emission of a phosphor containing substantially no Mg; the "control" phosphor having no Mg being represented by the formula $(Sr_{0.6}Ba_{0.4})_2SiO_4$:$Eu^{2+}$F. The purpose of choosing this series of compositions was to show the effect of substituting Mg first for Sr, leaving the Ba concentration constant, and then substituting Mg for Ba, leaving the Sr concentration constant.

Referring to FIG. 7, it may be seen that Mg addition increases the intensity of the emission. Looking at the peak of the emission intensity at about 540 nm for all three phosphors, the phosphor demonstrating the lowest emission intensity of the three was the control phosphor, $(Sr_{0.6}Ba_{0.4})_2SiO_4$:$Eu^{2+}$F. The phosphor that substituted Mg for Ba demonstrated an increase in emission intensity of about 6 to 7 percent relative to the control phosphor, and the phosphor that substituted Mg for Sr demonstrated an increase in emission intensity of about 10 percent relative to the control phosphor. It may also be observed that Mg inclusion shifts the wavelength at which peak emission occurs to longer wavelengths (i.e., slightly towards yellow and away from green), and this effect is more noticeable when Mg substitutes for Ba than when Mg substitutes for Sr.

The differences in the peak heights of the excitation radiation at 450 nm is not important for the purposes of this discussion, as the differences in those peak heights have more to do with particle size distributions of the three phosphors, than a chemical effect.

The Effects of Including $A_2$ Cations and $A_3$ Anions in Silicate-Based Green Phosphors The present inventors have carried out experiments to delineate the effects of including $A_2$ cations and $A_3$ anions inclusion in the instant silicate-based green phosphors, particularly when the $A_2$ cation is phosphorus and when the $A_3$ anion is a monovalent halogen. Exemplary phosphors were optically characterized in several ways. First, and perhaps most revealing, were tests conducted to evaluate the intensity of the light emitted from the phosphor as a function of wavelength, wherein the test was carried out on a series of phosphor compositions that varied in the concentration of either the $A_2$ or $A_3$ ions. From this data, it is useful to construct a graph of peak emission intensities, as a function of $A_2$ and/or $A_3$ ion concentration. Also useful is the construction of a graph of peak emission wavelength, again as a function of $A_2$ and/or $A_3$ ion concentration.

Illustrative data is shown in FIGS. 8-12. The phosphor chosen to illustrate the inventive concept was a yellow-green phosphor when $A_2$ is P, and $A_3$ is selected from the group consisting of F, Cl in the formula $[(Sr_{1-x}Ba_x)_{0.98}Eu_{0.02}]_2(Si,P)O_{4-y}(F,Cl)_y$. The results of such a composition are shown where the inclusion of phosphorus is compared to the results obtained for chlorine and fluorine. While not wishing to be bound by any particular theory, it is believed that phosphorus substitutes for silicon in the compound, whereas the fluorine or chlorine dopants substitute for oxygen. Furthermore, the formula is written with F and Cl inside the parenthesis, separated by a comma, to indicate that F and Cl may be used either individually, or in combination.

Figure 8:
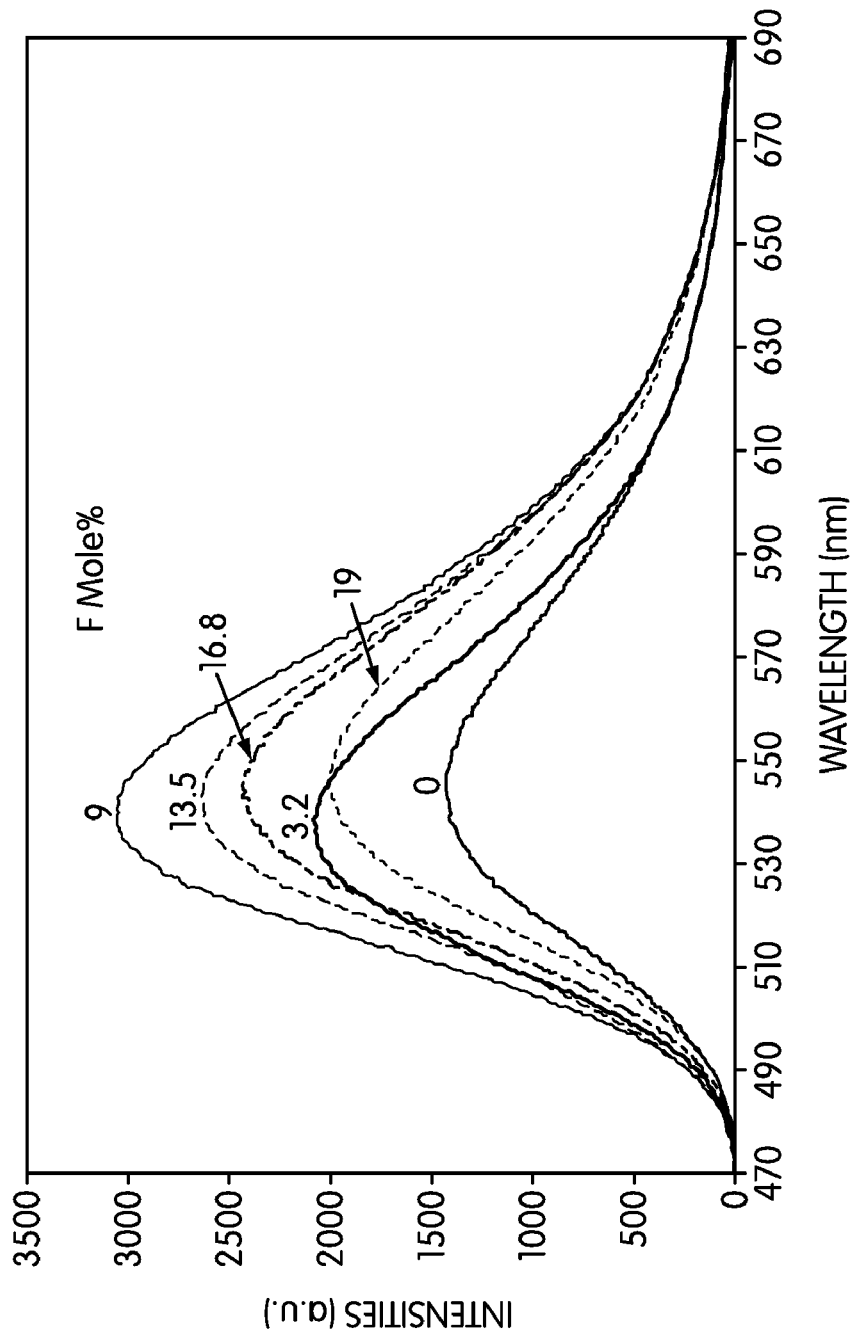
FIG. 8 is a collection of emission spectra of exemplary compositions having the formula $(Sr,A_1)_x(Si,A_2)(O,A_3)_{2+x}:Eu^{2+}$ where $A_3$ is fluorine; these compositions may be written in the formula $[(Sr_{0.7}Ba_{0.3})_{0.98}Eu_{0.02}]_2SiO_{4-y}F_y$, where y represents the mole percent of fluorine in a series where the fluorine content is varied.

Referring to FIG. 8, the emission spectra was taken of a series of six compositions for the composition $[(Sr_{0.7}Ba_{0.3})_{0.98}Eu_{0.02}]2(Si,P)O_{4-y}(F,Cl)_y$, where the mole percent (mol %) of the fluorine was 0, 3.2, 13.5, 9.0, 16.8, and 19.0, respectively. The wavelength of the excitation radiation in this experiment was 450 nm, and so light from this blue LED may be considered to contribute to the subsequently produced white light illumination. The results of FIG. 8 show that the emission intensity from this phosphor is significantly increased by doping the compositions with fluorine for concentrations up to about 10 mol %, at which point the intensity begins to fall off as the fluorine concentration is increased further.

Figure 9:
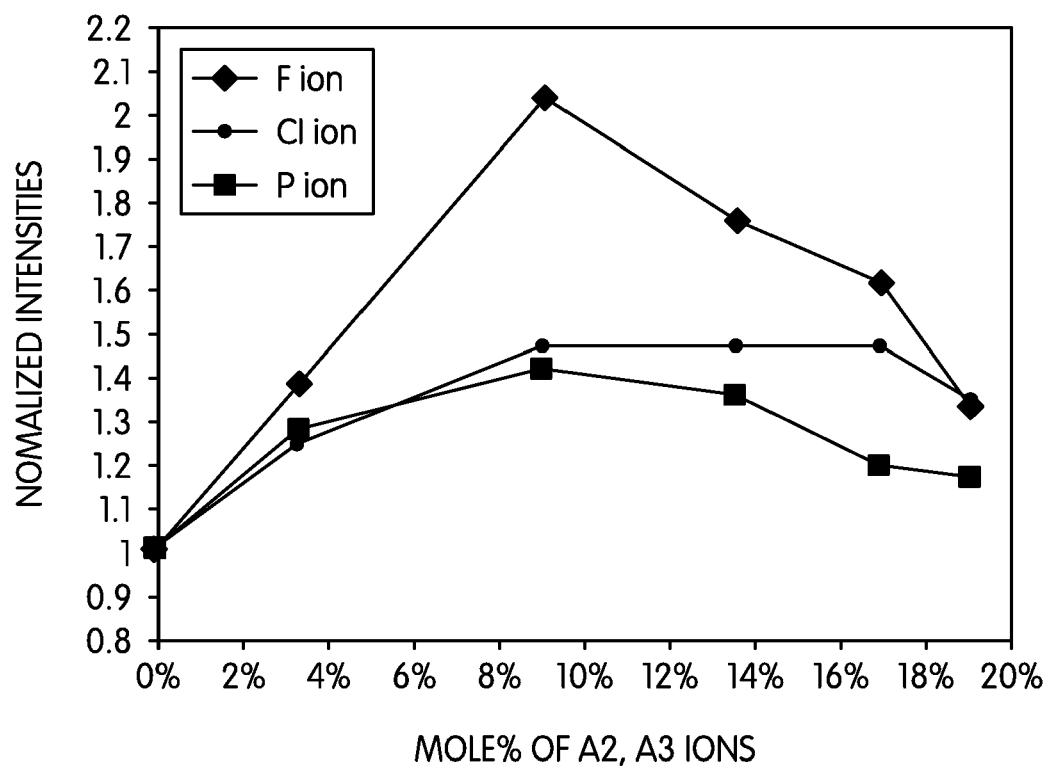
FIG. 9 is a graph of emission intensities as a function of the $A_3$ anion in the formula $(Sr,A_1)_x(Si,A_2)(O,A_3)_{2+x}:Eu^{2+}$, where $A_3$ in this experiment was either F, Cl, or P; x for these exemplary phosphors being about 2, and the identities $A_1$ and $A_2$ for this experiment defined by $[(Sr_{0.7}Ba_{0.3})_{0.98}Eu_{0.02}]_2SiO_{4-y}F_y$, where y represents the mole percent of $A_3$.

The data from FIG. 8 may be plotted in a slightly different way: the value of the emission intensity at the maximum of each of the peaks may be plotted as a function of fluorine content, as shown for F using the triangle symbols in FIG. 9. For example, since the curve in FIG. 8 exhibiting the highest intensity occurred for the composition having a fluorine content of 9 mol %, the highest point of the F-ion curve in FIG. 9 occurs at a location on the x-axis also at 9 mol %. What makes FIG. 9 interesting (and the reason for plotting the data in this manner), is that such a plot allows different ions to be compared. Referring to FIG. 9, normalized peak emission intensities have been plotted as a function of doping concentration of the halogens fluorine (triangles) and chlorine (circles), versus phosphorus (squares), again where the host phosphor comprised a silicate with Sr and Ba alkaline earth components in mole ratio 0.7 and 0.3, respectively.

The data in FIG. 9 shows that the fluorine anion is capable of increasing emission intensity, relative to P and Cl, in this particular phosphor system under study. It is interesting to note that the F and P compositions both peaked at about 9 mol %, whereas the Cl emission intensity was relatively constant over the range 9 to 17 mol %, and may even have shown a slight increase over the 9 to 17 mol % range. It should also be noted that whereas the increase offered by the Cl and P compositions is significant, being about a 40 to 50% in normalized intensity at an optimized concentration, the advantage may not appear to be significant only because of the huge increase of 100% that the F composition displayed. Furthermore, there may be advantages offered by the relatively flat curve of the Cl composition, in this instance, where fabrication difficulties and/or inconsistencies in content tolerances may be ignored because of the relative constant nature of the emission over a range of compositions (e.g., Cl content ranging from 9 to 17 mol %).

Figure 10:
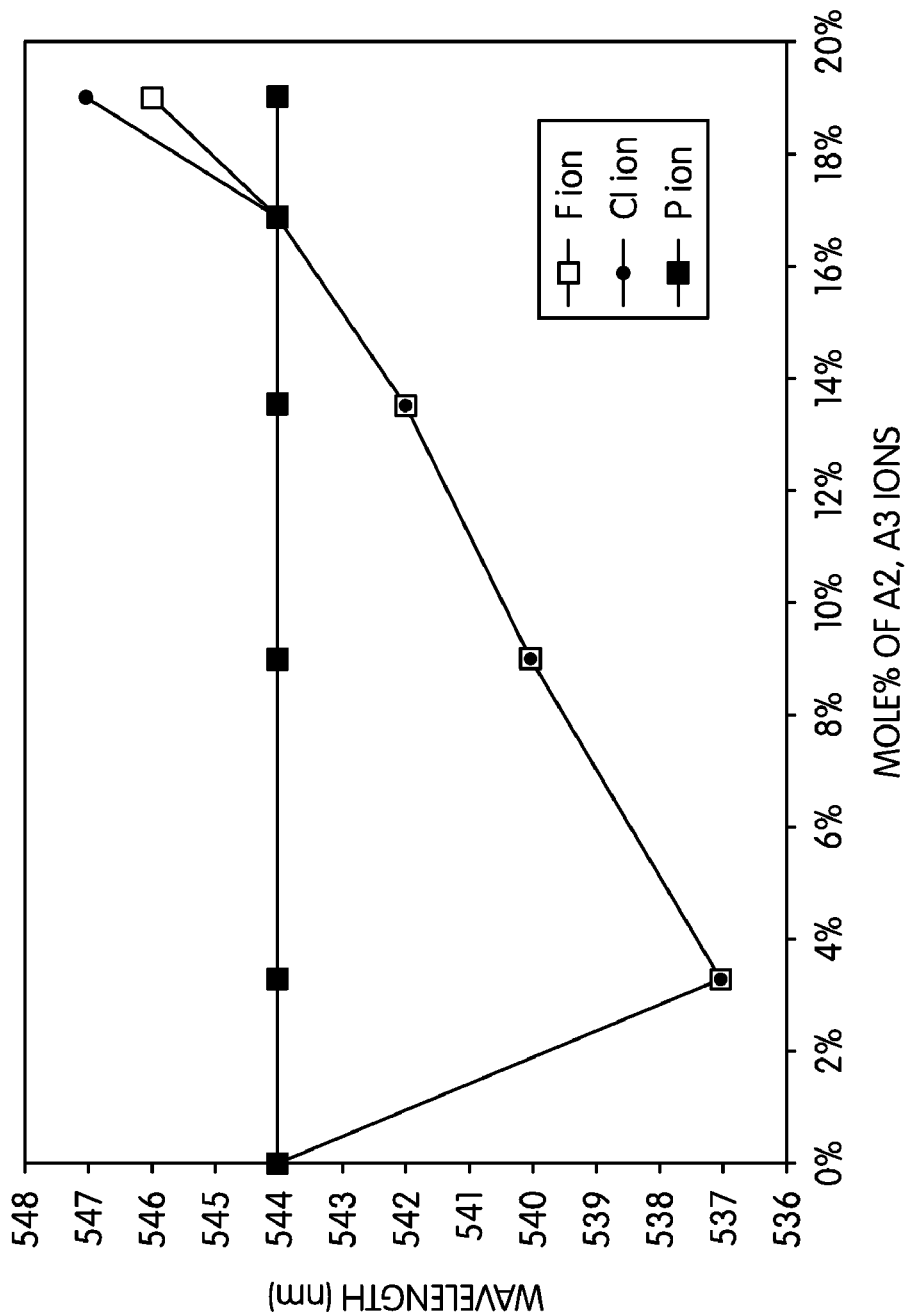
FIG. 10 is a graph of the wavelength at which the maximum emission intensity occurs as a function of the mole percent of $A_2$ and $A_3$ present, where $A_3$ in this experiment was F, Cl, and $A_2$ was P; the identities of $A_1$, $A_2$ and $A_3$ for this experiment defined by the formula $[(Sr_{0.7}Ba_{0.3})_{0.98}Eu_{0.02}]_2SiO_{4-y}F_y$ when $A_3$ is F; $[(Sr_{0.7}Ba_{0.3})_{0.98}Eu_{0.02}]_2SiO_{4-y}Cl_y$ when $A_3$ is Cl; and $[(Sr_{0.7}Ba_{0.3})_{0.98}Eu_{0.02}]_2(Si,P)O_{4-y}$ when $A_2$ is P.
Figure 11:
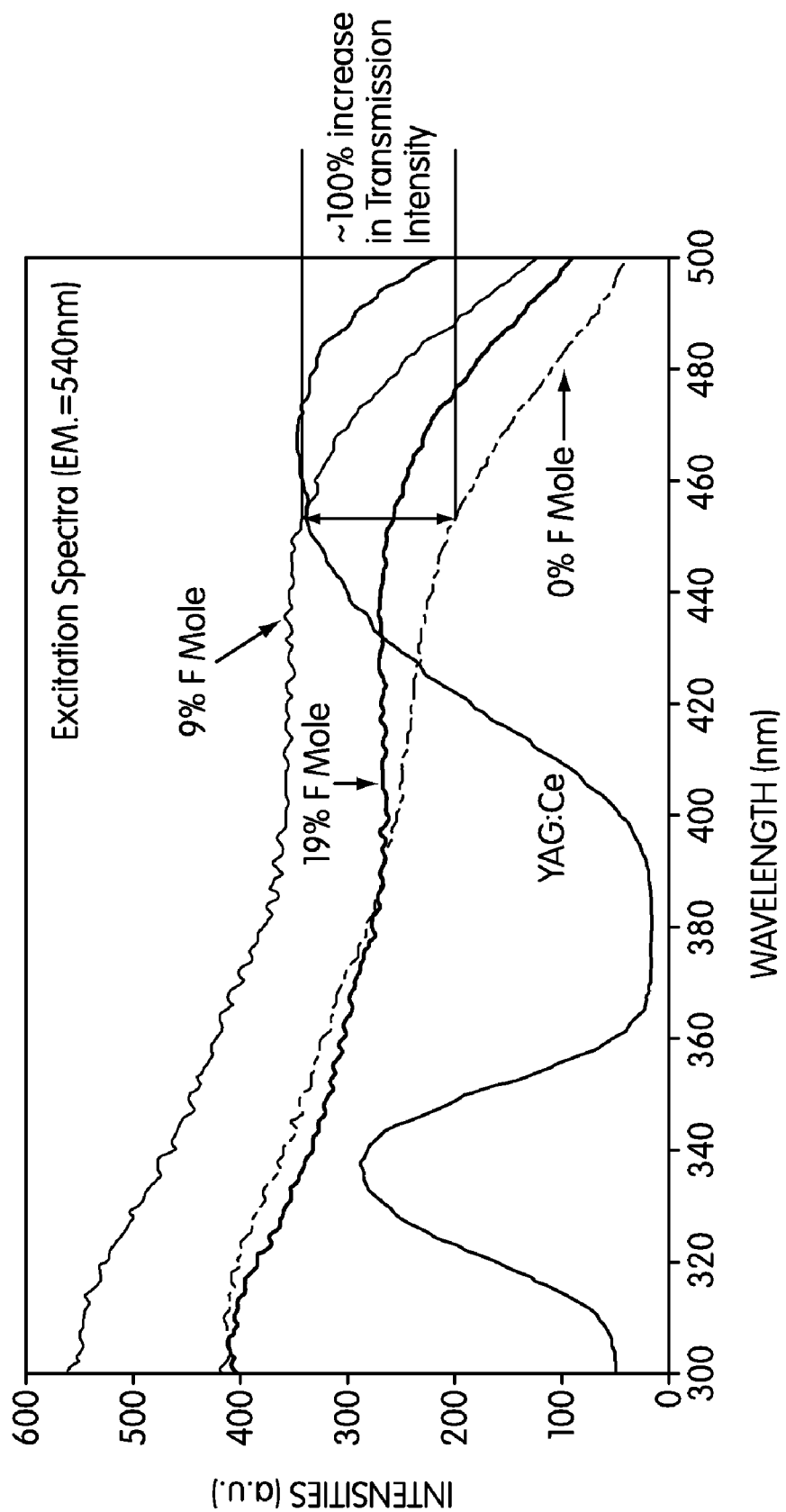
FIG. 11 is a graph of the excitation spectra comparing fluorine containing silicate phosphors of the present embodiments with non-fluorine containing silicates, confirming the role that the $A_3$ anion plays in the present embodiments.

Just as normalized peak emission intensity may be plotted as a function of doping concentration for a series of $A_2$ and $A_3$ ions (in this case P as an $A_2$ ion and F, Cl as $A_3$ ions), so too may the wavelength at which that peak emission occurs be plotted as a function of wavelength. This data is shown in FIG. 10, again for the family of compositions $[(Sr_{0.7}Ba_{0.3})_{0.98}Eu_{0.02}]2(Si,P)O_{4-y}(F,Cl)_y$, where y ranges from 0 to 19 mol %. As before, the wavelength of the excitation radiation was about 450 nm. The results of FIG. 10 show that the peak emission wavelength does not significantly vary with concentration for P, but does decrease for F and Cl with increasing dopant concentration to a value between about 2 and 4 mol %, steadily increasing thereafter. FIG. 11 is an example of excitation spectra from an exemplary phosphor, tested with an excitation wavelength of about 450 nm, affected by fluorine content in the inventive silicate based phosphors. The excitation curve was produced as described before; wherein light emitted at 540 nm was measured as a function of excitation wavelength. This data clearly shows once more that the fluorine dramatically changed the excitation spectra of these silicate-based phosphors. This has a tremendous impact on both "single color" (such as green) and white illumination systems, since the 100 percent increase in emission intensity at the excitation wavelength range of 430 to 490 nm (within the range of a blue LED) was achieved with only about a 10 percent increase (mole percent) in fluorine concentration.

There are a variety of ways in which to include an $A_3$ ion in the present silicate-based green phosphors; in one embodiment, fluorine is added to the phosphor composition in the form of a $NH_4F$ dopant. That the $A_3$ ion is actually present in the phosphor has been demonstrated by the present inventors for the case of F using secondary ion mass spectroscopy (SIMS), the results shown in FIG. 12 (where increasing the mole percentage of F in the raw material from about 0 to 70 mole percent increased the F content in the actual phosphor product from about 0 to 19 mole percent). The present inventors have found that when the $NH_4F$ dopant amount is very small (about 1%), the position of the peak emission is located at shorter wavelengths, and as more $NH_4F$ is added, the wavelength increases with dopant amount. While not wishing to be bound by any particular theory, it is believed that the luminescence of the Eu doped phosphor is due to the presence of the $Eu^{2+}$ in the compound, which undergoes an electronic transition from $4f^65d^1$ to $4f^7$. The wavelength positions of the emission bands depend very much on the host's material or crystal structure, changing from the near-UV to the red region of the spectrum. This dependence is interpreted as due to the crystal field splitting of the 5d level. With increasing crystal field strength, the emission bands shift to longer wavelength. The luminescence peak energy of the 5d-4f transition is affected most by crystal parameters denoting electron-electron repulsion; in other word, the distance between $Eu^{2+}$ cation and surrounding anions, and the average distance to distant cations and anions.

In the presence of small amounts of $NH_4F$, the fluorine anion dopant functions predominantly as a flux during sintering processing. Generally, a flux improves sintering processing in one of two ways: the first is to promote crystal growth with the liquid sintering mechanism, and the second is to absorb and collect the impurities from the crystal grains and improve the phase purity of the sintered materials. In one embodiment of the present invention, the host phosphor is $(Sr_{1-x}Ba_x)_2SiO_4$. Both Sr and Ba are very large cations. There may be present smaller cations such as Mg and Ca, which may be considered to be impurities. Therefore, further purification of host lattice will lead to more perfect symmetric crystal lattice and a larger distance between cations and anions, with a result of a weakening of the crystal field strength. This is the reason that small amount doping of $NH_4F$ moves the emission peak to shorter wavelength. The emission intensity increases with this small amount of F doping attributes to a higher quality crystal with fewer defects.

When the amounts of $NH_4F$ are increased even further, some of the $F^-$ anions will replace $O^{2-}$ anions, and become incorporated into the lattice. Cation vacancies will be created in order to maintain an electrical charge neutrality. Since the vacancies in the cation positions reduce the average distance between cations and anions, the crystal field strength will be increased. Therefore, the peak of the emission curves will move to longer wavelength as the $NH_4F$ content increases due to the increased number of cation vacancies. The emission wavelength is directly related to the energy gap between ground and excitation states which is determined only by the crystal field strength. The result of emission wavelength increases with the fluorine and chlorine is strong evidence of fluorine or chlorine incorporating into the host lattice, most likely in substitute of oxygen sites. On the other hand, the addition of a phosphate ion does not substantially change the emission wavelength, as expected. This is again evidence that phosphate acts as a cation, will not replace oxygen, and thus will not be easily incorporated into the lattice to change the host material's crystal field strength. This is particularly true of the crystal field surrounding the $Eu^{2+}$ ions, which consist essentially of oxygen sites. The improvement in the emission intensity gained by adding $NH_4H_2PO_4$ indicates that it works a flux agent as discussed above.

The excitation spectra comparing fluorine containing silicates and non-fluorine containing silicates, as shown in FIG. 11, further confirmed the critical role that fluorine plays in the present embodiments of the present halide containing silicate phosphors. The excitation spectra shown in FIG. 11 is obtained by plotting the emission intensity at the wavelength of 540 nm verses an excitation wavelength. The excitation intensity is directly related to the absorption and determined by excitation and transmission probability between excitation level and ground level. The dramatic increase in excitation intensity above 400 nm by introduction of fluorine into the silicate phosphor indicates again strongly that fluorine incorporates into the silicate lattice and changed dramatically the symmetrical surrounding of $Eu^{+2}$ to nonsymmetrical structure, which directly increases the probability of emission and transmission between emission sate to ground state. From FIG. 11 one skilled in the art may see that about 10 mol % fluorine in silicate phosphor can increase about 100% emission intensity of non-fluorine contained silicate phosphor in the excitation wavelength from 450 nm to 480 nm which is the most important for RGB backlighting and white LED applications.

The emission intensity decreases or levels off when the halide concentration increases more than about 10 mol %, as previously shown in FIG. 8. This can be explained by Eu emission quenching due to the fact that more defects introduced in associated with the fluorine incorporation into the lattice, the more non-radiation centers will be created to reduce the absorbed energy transferring to $Eu^{2+}$ effective emission centers. The result in FIG. 8 indicates the maximum intensity increase by fluorine without Eu emission quenching is about 10 mol %.

Comparison of an Exemplary Green Illumination System to a Prior Art Green LED

Figure 13:
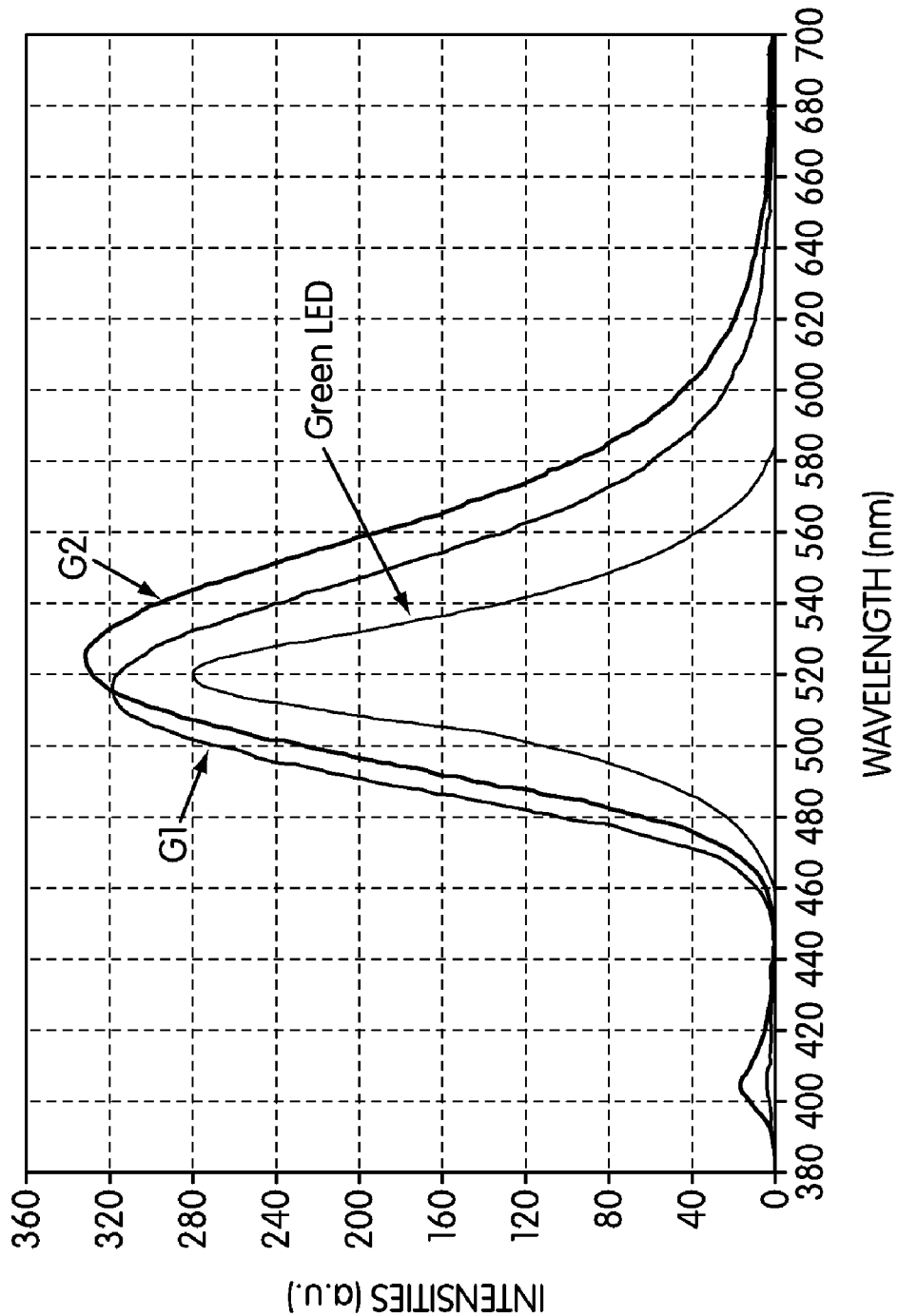
FIG. 13 is a comparison of the emission spectra of two phosphor-containing, green light emitting systems (using non-visible, UV-LED sources to excite the green phosphors) relative to a conventional green LED integrated circuit "chip,"

An exemplary green illumination system according to the present embodiments comprises an excitation radiation source in combination with a silicate-based green phosphor having the formula $(Sr,A_1)_x(Si,A_2)(O,A_3)_{2+x}:Eu^{2+}$, with $A_1$, $A_2$, $A_3$, and x defined as above. The performance of exemplary green phosphors in a green illumination system may be compared to that of a conventional green LED integrated circuit "chip." Such data is shown in FIG. 13.

Emission spectra for the two exemplary green phosphors having the formulas $(Sr_{0.2}Ba_{0.8})_2SiO_4:Eu^{2+}F$, which emits at about 520 nm, and $(Sr_{0.3}Ba_{0.7})_2SiO_4:Eu_{2+}F$, which emits at about 525 nm, was measured when each was excited by a substantially non-visible UV LED that emitted at about 400 nm. These phosphors may be referred to as the "G1" and "G2" phosphors, respectively. "Brightness" in the context of this experiment is defined as the integrated area under the curves in FIG. 13, not just the peak height.

The green illumination system based on the G1 phosphor exhibited a brightness of about 1527 mcd (63 lm/W), with CIE coordinates of (0.206, 0.603). The green illumination system based on the G2 phosphor, packaged on a UV chip providing excitation radiation at about 400 nm, exhibited a brightness of about 1855 mcd (76 lm/W), with CIE coordinates of (0.280, 0.620). This data is to be compared with the prior art green LED, which displayed a brightness of about 1119 mcd (51 lm/W). The CIE coordinates of the conventional green LED were (0.170, 0.710). Thus, FIG. 13 demonstrates the enhanced brightness that may be realized with the present phosphor-containing systems relative to a conventional green LED chip.

Figure 14A:
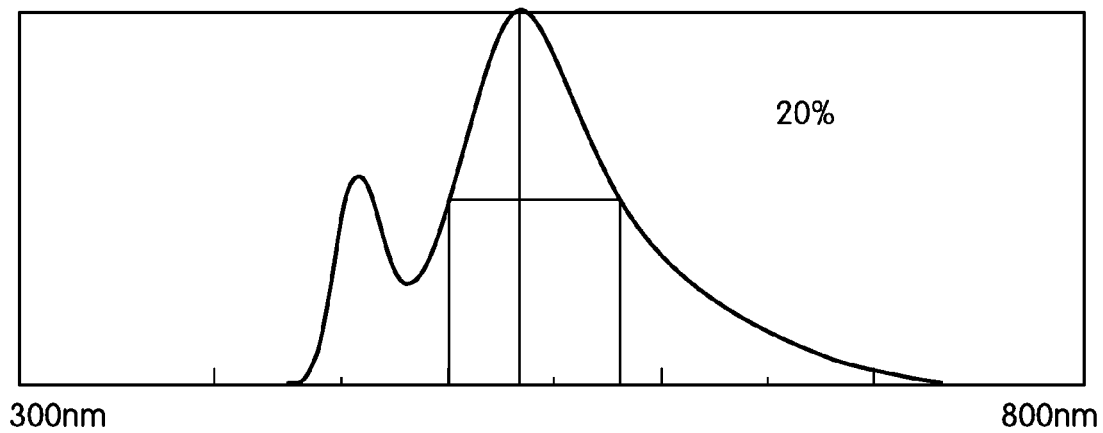

The Effects of Varying the Concentration of the Green Phosphor in an Illumination System The effects of varying the concentration of on of the present green phosphors in an illumination system are shown in FIG. 14. FIG. 14 is an emission spectra for two different concentrations of an exemplary phosphor in a green light emitting system, wherein the green phosphor is excited using a non-visible UV LED radiation source. This exemplary green phosphor has the formula $(Sr_{0.4}Ba_{0.6})_2SiO_4:Eu^{2+}F$, and may be given the designation "G3." The G3 phosphor emits its highest intensity light at a wavelength of about 532 nm when excited with 450 nm radiation. The concentration of the G3 phosphor in the emission spectrum labeled FIG. 14A is 20%, and the concentration of this same G3 phosphor in the emission spectrum labeled 12B is 25%.

Figure 14B:
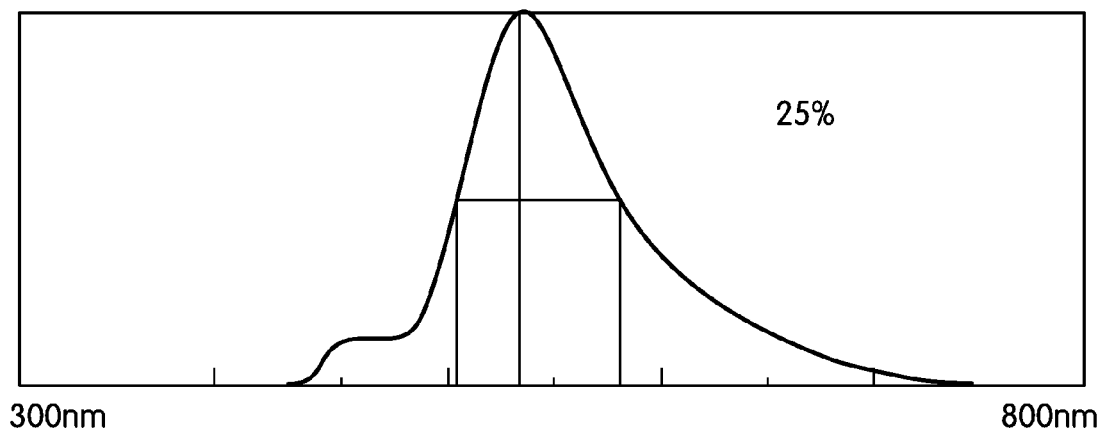

Comparison of FIGS. 14A and 14B show how the overall emission (in terms of color) for a green emission system may be controlled by varying the concentration of the green phosphor. In FIG. 14A, the 20% concentration of the green phosphor G3 is not sufficient to absorb all of the 450 nm, non-visible blue light from the excitation source, and some of this blue light makes its way to the detector (which may be seen by the small shoulder of the main peak). When the concentration is increased to 25%, however, as shown in FIG. 14B, there is enough green phosphor present in the green illumination system to absorb most of the blue light from the 450 nm blue chip LED, and the small shoulder to the left of the main green peak at 532 nm has all but disappeared.

That increasing the concentration of the green phosphor in the green illumination system has an effect on the overall color output of the system may be seen by examining the CIE coordinates of each of the two systems exemplified by FIGS. 14A and 14B. The CIE coordinates of FIG. 14A, with 20% of the green phosphor G3, were (0.328, 0.580). The CIE coordinates of FIG. 14B, with 25% of the green phosphor, were (9.291, 0.473). The brightness of each of these two illuminations was similar but not quite the same: 1378 mcd and 1494 mcd for FIGS. 14A and 14B, respectively. This is to be compared with a brightness of 1119 mcd for a conventional green LED, with CIE coordinates of (0.170, 0.710), as before.

A second application that illustrates how the concentration of the green phosphor in a green illumination system effects optical properties may be seen in FIG. 13, which is a CIE diagram. White light illumination is constructed by mixing various or several monochromatic colors from the visible portion of the electromagnetic spectrum, the visible portion of the spectrum comprising roughly 400 to 700 nm. The human eye is most sensitive to a region between about 475 and 650 nm. To create white light from either a system of LED's, or a system of phosphors pumped by a short wavelength LED, it is necessary to mix light from at least two complementary sources in the proper intensity ratio. The results of the color mixing are commonly displayed in a CIE "chromaticity diagram," where monochromatic colors are located on the periphery of the diagram, and white at the center. Thus, the objective is to blend colors such that the resulting light may be mapped to coordinates at the center of the diagram.

Another term of art is "color temperature," which is used to describe the spectral properties of white light illumination. The term does not have any physical meaning for "white light" LED's, but it is used in the art to relate the color coordinates of the white light to the color coordinates achieved by a black-body source. High color temperature LED's versus low color temperature LED's are shown at www.korry.com.

Chromaticity (color coordinates on a CIE chromaticity diagram) has been described by Srivastava et al. in U.S. Pat. No. 6,621,211. The chromaticity of the prior art blue LED-YAG:Ce phosphor white light illumination system described above are located adjacent to the so-called "black body locus," or BBL, between the temperatures of 6000 and 8000 K. White light illumination systems that display chromaticity coordinates adjacent to the BBL obey Planck's equation (described at column 1, lines 60-65 of that patent), and are desirable because such systems yield white light which is pleasing to a human observer.

The color rendering index (CRI) is a relative measurement of how an illumination system compares to that of a black body radiator. The CRI is equal to 100 if the color coordinates of a set of test colors being illuminated by the white light illumination system are the same as the coordinates generated by the same set of test colors being irradiated by a black body radiator.

The green illumination system used to obtain the data of FIG. 15 is used in this disclosure an exemplary silicate-based green phosphor according to the present embodiments, the green phosphor coating a blue LED providing excitation radiation at about 450 nm, and the results shown schematically on a CIE diagram. The amount of the green phosphor in these systems was varied by increasing the thickness of the phosphor-containing layer on the blue LED, as shown schematically by the four diagrammatic representations of green light illumination systems located on the CIE diagram of FIG. 15, the four representations of phosphor amount on the blue LED designated by reference numerals 15A, 15B, 15C, and 15D.

The illumination system depicted by the diagram at 15A consists solely of the blue LED excitation source, and the radiation that emits from this device may be plotted on the CIE diagram at x-y coordinates of about (0.20, 0.15). As some of the green phosphor is coated onto the blue LED, and thus as some green light is mixed with some blue light from the 450 nm LED, the overall color output shifts upward on the diagram to a position denoted roughly by the coordinates (0.20, 0.25). This situation is depicted schematically by the device located at reference numeral 15B, and the blue-green color may be described as "cyan."

Still further increases in the amount of the green phosphor coating the blue LED, shown at reference numeral 15C, increase the color output to CIE color coordinates of (0.25, 0.45). When the amount of the phosphor is increased to the thickest of the four coatings, shown schematically at 15D, the color becomes about (0.30, 0.50). It will be noted by one skilled in the art that the manner in which the amount of the phosphor is varied is not important; for example, the amount of phosphor may be changed (either increased or decreased) by changing the thickness of a phosphor layer having substantially constant concentration, or by changing the concentration of the phosphor within a layer of substantially constant thickness.

Temperature Effects

The dependence of the emission intensity on temperature for the novel silicate-based green phosphors is shown in FIG. 16. FIG. 16 is a graph of the maximum intensity of two exemplary green phosphors labeled "G2" and "G3," each excited at 450 nm, and measured at temperatures ranging from about 20° C. to about 180° C. Also included in the graph is data from a silicate-based yellow-green phosphor labeled "A."

It may be seen from FIG. 16 that the performance of the present green phosphor is essentially constant over this temperature range, at least to 120° C., and that the emission intensity of the phosphor only decreases by about 10 percent over this range. The intensity of all three of these novel silicate-based phosphors remains above about 70 percent when heated to about 180° C.

The UV and Blue LED Radiation Sources

In certain embodiments, the blue light emitting LED emits light having a main emission peak in the wavelength range greater than or equal to about 400 nm, and less than or equal to about 520 nm. This light serves two purposes: 1) it provides the excitation radiation to the phosphor system, and 2) it provides blue light which, when combined with the light emitted from the phosphor system, makes up the white light of the white light illumination.

In certain embodiments, the blue LED emits light greater than or equal to about 420 nm, and less than or equal to about 500 nm. In yet another embodiment, the blue LED emits light greater than or equal to about 430 and less than or equal to about 480 nm. The blue LED wavelength may be 450 nm.

The blue light emitting device of the present embodiments is herein described generically as a "blue LED," but it will be understood by those skilled in the art that the blue light emitting device may be at least one of (wherein it is contemplated to have several operating simultaneously) a blue light emitting diode, a laser diode, a surface emitting laser diode, a resonant cavity light emitting diode, an inorganic electroluminescence device and an organic electroluminescence device. If the blue light emitting device is an inorganic device, it may be a semiconductor selected from the group consisting of a gallium nitride based compound semiconductor, a zinc selenide semiconductor and a zinc oxide semiconductor.

In alternative embodiments, the novel green phosphors are excited by a radiation source emitting at wavelengths less than about 400 nm. Such a radiation source that emits substantially non-visible light may be a UV LED, or any of the other types of radiation sources listed above for the blue LED.

In one embodiment of the present invention, a green illumination system may be constructed by combining any of the silicate-based green phosphors described herein with a GaN based blue LED having a emission peak wavelength ranging about 430 nm to 480 nm. But it will be understood by those skilled in the art that in addition to combining light emitted from the present green phosphors with a blue LED, the green light may be combined with light from other visible blue radiation sources, such as light from aluminate-based blue phosphors, aluminate-based green phosphors, and silicate-based yellow and orange phosphors. These systems will be described next.

The Inventive Green Phosphor in Combination with Other Phosphors

Examples of blue phosphors that may be used in keeping with the above concept have been described in a U.S. patent application Ser. No. 11/173,342, titled "Aluminate-based blue phosphors," filed Jul. 1, 2005, by inventors Ning Wang, Yi Dong, Shifan Cheng, and Yi-Qun Li, now U.S. Pat. No. 7,390,437, issued Jun. 24, 2008 and assigned to Internatix Corporation of Fremont, Calif. Of course, virtually any blue phosphor may be appropriate for this application, including commercial BAM phosphors, but the Internatix phosphors work particularly well. These phosphors may be described by the generalized formula $(M_{1-x}Eu_x)_{2-z}Mg_zAl_yO_{[1+(3/2)y]}$, where M is at least one of Ba or Sr. These blue phosphors may emit at wavelengths ranging from about 420 to 560 nm.

Alternatively, the present green phosphors may be used in combination with a yellow phosphor (with or without blue light from a blue LED excitation source; and with or without a blue phosphor, green phosphor, red phosphor, etc.) such as those commercially available yellow phosphors (e.g., a YAG:Ce phosphor), or a yellow phosphor in keeping with concepts described in a patent application titled "Novel silicate based yellow-green phosphors," U.S. patent application Ser. No. 10/948,764, filed Sep. 22, 2004, by inventors Ning Wang, Yi Dong, Shifan Cheng, and Yi-Qun Li, now U.S. Pat. No. 7,311,858, issued Dec. 25, 2007. Of course, virtually any yellow phosphor may be appropriate for this application. These phosphors may be described by the generalized formula $A_2SiO_4:Eu^{2+}D$, where A is at least one divalent metal selected from the group consisting of Sr, Ca, Ba, Mg, Zn, and Cd, and D is a dopant detected from the group consisting of F, Cl, Br, I, P, S, and N. These phosphors may alternatively be written as $A_2Si(O,D)_4:Eu^{2+}$, showing that the D dopant resides on oxygen lattice sites in the host crystal, and is not positioned on silicon lattice sites. They are configured to emit light having a wavelength ranging from about 280 to 490 nm.

Alternatively, the present silicate-based green phosphors may be used in combination with conventional, commercially available green phosphors, or novel aluminate-based green phosphors developed by the present inventors, as described in U.S. patent application Ser. No. 11/036,914 filed Jan. 14, 2005, titled "Novel aluminate-based green phosphors" by inventors Ning Wang, Yi Dong, Shifan Cheng, and Yi-Qun Li, now U.S. Pat. No. 7,541,728, issued Jun. 2, 2009, and discloses compounds which may be described by the generalized formula $M_{1-x}Eu_xAl_yO_{[1+(3/2)y]}$. In this formula, M is at least one divalent metal selected from the group consisting of Sr, Ca, Ba, Mg, Mn, Zn, Cu, Sm, Tm, and Cd. These aluminate-based green phosphors are configured to emit light having a wavelength ranging from about 500 to 550 nm.

Silicate-based orange phosphors that may be used in combination with the present green phosphors have the formula $(Sr,A_1)_x(Si,A_2)(O,A_3)_{2+x}:Eu^{2+}$, as described in the priority U.S. application Ser. No. 11/258,679, filed Oct. 25, 2005 and issued Feb. 2, 2010 as U.S. Pat. No. 7,655,156, titled "Silicate-based orange phosphors" by inventors Shifan Cheng, Dejie Tao, Yi Dong, and Yi-Qun Li. In the formula, $A_1$ is at least one divalent cation (a 2+ ion) including magnesium (Mg), calcium (Ca), barium (Ba), or zinc (Zn), or a combination of 1+ and 3+ cations; $A_2$ is a 3+, 4+, or 5+ cation, including at least one of boron (B), aluminum (Al), gallium (Ga), carbon (C), germanium (Ge), nitrogen (N), and phosphorus (P); $A_3$ is a 1−, 2−, or 3− anion, including fluorine (F), chlorine (Cl), bromine (Br), and sulfur (S); and x is any value between 2.5 and 3.5, both inclusive. Though not wishing to be bound to any particular theory, the formula is written to indicate that the $A_1$ cation replaces strontium (Sr); the $A_2$ cation replaces silicon (Si), and the $A_3$ anion replaces oxygen (O).

Of course, the present silicate-based green phosphors may be used with known yellow, orange, or red phosphors. For example, U.S. Pat. No. 6,649,946 to Bogner et al. disclosed yellow to red phosphors based on alkaline earth silicon nitride materials as host lattices, where the phosphors may be excited by a blue LED emitting at 450 nm. The red to yellow emitting phosphors uses a host lattice of the nitridosilicate type $M_xSi_yN_z:Eu$, wherein M is at least one of an alkaline earth metal chosen from the group Ca, Sr, and Ba, and wherein z= ⅔ x+4/3 y. One example of a material composition is $Sr_2Si_5N_8:Eu^{2+}$. The use of such red to yellow phosphors was disclosed with a blue light emitting primary source together with one or more red and green phosphors. The objective of such a material was to improve the red color rendition R9 (adjust the color rendering to red-shift), as well as providing a light source with an improved overall color rendition Ra.

Another example of a disclosure of supplementary phosphors, including red phosphors, that may be used with the present silicate-based green phosphors, may be found in U.S. Patent Publication 2003/0006702 to Mueller-Mach, which disclosed a light emitting device having a (supplemental) fluorescent material that receives primary light from a blue LED having a peak wavelength of 470 nm, the supplemental fluorescent material radiating light in the red spectral region of the visible light spectrum. The supplementary fluorescent material is used in conjunction with a main fluorescent material to increase the red color component of the composite output light, thus improving the white output light color rendering. In a first embodiment, the main fluorescent material is a Ce activated and Gd doped yttrium aluminum garnet (YAG), while the supplementary fluorescent material is produced by doping the YAG main fluorescent material with Pr. In a second embodiment, the supplementary fluorescent material is a Eu activated SrS phosphor. The red phosphor may be, for example, $(SrBaCa)_2Si_5N_8:Eu^{2+}$. The main fluorescent material (YAG phosphor) has the property of emitting yellow light in response to the primary light from the blue LED. The supplementary fluorescent material adds red light to the blue light from the blue LED and the yellow light from the main fluorescent material.

U.S. Pat. No. 6,621,211 to Srivastava et al discloses a method of producing white light using a non-visible UV LED. This patent describes the use of supplementary green, orange, and/or red phosphors used in the phosphor system. The white light produced in this method was created by non-visible radiation impinging on three, and optionally a fourth, phosphor, of the following types: the first phosphor emitted orange light having a peak emission wavelength between 575 and 620 nm, and preferably comprised a europium and manganese doped alkaline earth pyrophosphate phosphor according to the formula $A_2P_2O_7$:$Eu^{2+}$, $Mn^{2+}$.

Alternatively, the formula for the orange phosphor could be written $(A_{1-x-y}Eu_xMn_y)_2P_2O_7$, where $0<x\leqq0.2$, and $0<y\leqq0.2$. The second phosphor emits blue-green light having a peak emission wavelength between 495 and 550 nm, and is a divalent europium activated alkaline earth silicate phosphor ASiO:$Eu^{2+}$, where A comprised at least one of Ba, Ca, Sr, or Mb. The third phosphor emitted blue light having a peak emission wavelength between 420 and 480 nm, and comprised either of the two commercially available phosphors "SECA," $D_5(PO_4)_3Cl$:$Eu^{2+}$, where D was at least one of Sr, Ba, Ca, or Mg, or "BAM," which may be written as $AMg_2Al_{16}O_{27}$, where A comprised at least one of Ba, Ca, or Sr, or $BaMgAl_{10}O_7$:$Eu^{2+}$. The optional fourth phosphor emits red light having a peak emission wavelength between 620 and 670 nm, and it may comprise a magnesium fluorogermanate phosphor MgO*MgF*GeO:$Mn^{4+}$. The present silicate-based green phosphors are contemplated to be used with the known phosphors of U.S. Pat. No. 6,621,211.

Many modifications of the illustrative embodiments of the invention disclosed above will readily occur to those skilled in the art. Accordingly, the invention is to be construed as including all structure and methods that fall within the scope of the appended claims.

What is claimed is:

1. A red-green-blue (RGB) backlighting or white light illumination system, comprising:
  a blue LED;
  a green phosphor having the formula $(Sr,A_1)_x(Si,A_2)(O,A_3)_{2+x}$:$Eu^{2+}$, where $A_1$ is at least one of a divalent alkaline earth or transition metal cation selected from the group consisting of Mg, Ca, Ba, and Zn and where the stoichiometric amount of $A_1$ varies 0.3 to 0.8, both inclusive; $A_2$ is P and $A_3$ is a halogen selected from the group consisting of F and Cl, where the amounts of $A_2$ and $A_3$ each range from 0 to 19 mole percent, both endpoints inclusive; and x is any value between 1.5 and 2.5, inclusive, subject to the proviso that x is not 2; and
  a red LED.

2. The RGB backlighting or white light illumination system of claim 1, wherein the blue LED emits visible light having wavelengths greater than or equal to about 400 nm, and less than or equal to about 520 nm.

3. A red-green-blue (RGB) backlighting or white light illumination system, comprising:
  a blue LED;
  a green phosphor having the formula $(Sr,A_1)_x(Si,A_2)(O,A_3)_{2+x}$:$Eu^{2+}$, where $A_1$ is at least one of a divalent alkaline earth or transition metal cation selected from the group consisting of Mg, Ca, Ba, and Zn and where the stoichiometric amount of $A_1$ varies 0.3 to 0.8, both inclusive; $A_2$ is P and $A_3$ is a halogen selected from the group consisting of F and Cl, where the amounts of $A_2$ and $A_3$ each range from 0 to 19 mole percent, both endpoints inclusive; and x is any value between 1.5 and 2.5, inclusive, subject to the proviso that x is not 2; and
  a red phosphor.

4. The RGB backlighting or white light illumination system of claim 3, wherein the blue LED emits visible light having wavelengths greater than or equal to about 400 nm, and less than or equal to about 520 nm.

5. The RGB backlighting or white light illumination system of claim 3, wherein the red phosphor is of the nitridosilicate type $M_xSi_yN_z$:Eu, where M is at least one of an alkaline earth metal selected from the group consisting of Ca, Sr, and Ba, and wherein $z=(2/3)(x)+(4/3)(y)$.

6. The RGB backlighting or white light illumination system of claim 3, where in the red phosphor is $(SrBaCa)_2Si_5N_8$:$Eu^{2+}$.

7. A red-green-blue (RGB) backlighting or white light illumination system, comprising:
  a blue LED;
  a green phosphor having the formula $(Sr,A_1)_x(Si,A_2)(O,A_3)_{2+x}$:$Eu^{2+}$, where $A_1$ is at least one of a divalent alkaline earth or transition metal cation selected from the group consisting of Mg, Ca, Ba, and Zn and where the stoichiometric amount of $A_1$ varies 0.3 to 0.8, both inclusive; $A_2$ is P and $A_3$ is a halogen selected from the group consisting of F and Cl, where the amounts of $A_2$ and $A_3$ each range from 3.2 to 19 mole percent, both endpoints inclusive; and x is any value between 1.5 and 2.5, both endpoints inclusive; and
  a red LED.

8. The RGB backlighting or white light illumination system of claim 7, wherein the blue LED emits visible light having wavelengths greater than or equal to about 400 nm, and less than or equal to about 520 nm.

9. A red-green-blue (RGB) backlighting or white light illumination system, comprising:
  a blue LED;
  a green phosphor having the formula $(Sr,A_1)_x(Si,A_2)(O,A_3)_{2+x}$:$Eu^{2+}$, where $A_1$ is at least one of a divalent alkaline earth or transition metal cation selected from the group consisting of Mg, Ca, Ba, and Zn and where the stoichiometric amount of $A_1$ varies 0.3 to 0.8, both inclusive; $A_2$ is P and $A_3$ is a halogen selected from the group consisting of F and Cl, where the amounts of $A_2$ and $A_3$ each range from 3.2 to 19 mole percent, both endpoints inclusive; and x is any value between 1.5 and 2.5, both endpoints inclusive; and
  a red phosphor.

10. The RGB backlighting or white light illumination system of claim 9, wherein the blue LED emits visible light having wavelengths greater than or equal to about 400 nm, and less than or equal to about 520 nm.

11. The RGB backlighting or white light illumination system of claim 9, wherein the red phosphor is of the nitridosilicate type $M_xSi_yN_z$:Eu, where M is at least one of an alkaline earth metal selected from the group consisting of Ca, Sr, and Ba, and wherein $z=(2/3)(x)+(4/3)(y)$.

12. The RGB backlighting or white light illumination system of claim 9, where in the red phosphor is $(SrBaCa)_2Si_5N_8$:$Eu^{2+}$.

* * * * *